(12) United States Patent
Kanda

(10) Patent No.: US 9,445,511 B2
(45) Date of Patent: Sep. 13, 2016

(54) METHOD FOR MANUFACTURING LAYERED CIRCUIT BOARD, LAYERED CIRCUIT BOARD, AND ELECTRONIC DEVICE

(71) Applicant: FUJITSU LIMITED, Kawasaki-shi, Kanagawa (JP)

(72) Inventor: Takashi Kanda, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 533 days.

(21) Appl. No.: 13/677,537

(22) Filed: Nov. 15, 2012

(65) Prior Publication Data

US 2013/0126221 A1 May 23, 2013

(30) Foreign Application Priority Data

Nov. 18, 2011 (JP) ................................. 2011-253326

(51) Int. Cl.
  *H05K 1/00* (2006.01)
  *H05K 3/46* (2006.01)
  *H05K 1/11* (2006.01)
  *H05K 3/40* (2006.01)

(52) U.S. Cl.
  CPC ............. *H05K 3/4617* (2013.01); *H05K 1/115* (2013.01); *H05K 3/4623* (2013.01); *H05K 3/4069* (2013.01)

(58) Field of Classification Search
  CPC .. H05K 3/4617; H05K 1/115; H05K 3/4623; H05K 3/4069; H05K 3/4611; H05K 3/462; H05K 3/4038; H05K 1/00
  USPC ........................................................ 174/258
  See application file for complete search history.

(56) References Cited

U.S. PATENT DOCUMENTS

| | | | |
|---|---|---|---|
| 2002/0170876 A1 | 11/2002 | Kawamoto et al. | |
| 2006/0222813 A1* | 10/2006 | Kato et al. | 428/131 |
| 2007/0289706 A1 | 12/2007 | Nakagawa et al. | |
| 2010/0233453 A1* | 9/2010 | Hashimoto | B32B 17/10018 428/216 |
| 2011/0100690 A1* | 5/2011 | Yoshimura et al. | 174/259 |

FOREIGN PATENT DOCUMENTS

| | | |
|---|---|---|
| JP | 62-243395 A | 10/1987 |
| JP | 07-176846 A | 7/1995 |
| JP | H07-283534 A | 10/1995 |

(Continued)

OTHER PUBLICATIONS

Japanese Office Action, with full English translation, dated May 26, 2015, for corresponding Japanese Patent Application No. 2011-253326.

*Primary Examiner* — Tremesha S Willis
(74) *Attorney, Agent, or Firm* — Squire Patton Boggs (US) LLP

(57) ABSTRACT

There is provided a manufacturing method of a layered circuit board in which a first board and a second board are layered. The method includes arranging an adhesive resin sheet on the first board so that one face faces the first board, the adhesive resin sheet including a plurality of variant via holes, an opening area on the one face of each of the plurality of variant via holes being larger than an opening area on the other face, filling the variant via holes with conductive paste, arranging the second board on the other face of the adhesive resin sheet after the filling with the conductive paste, and performing heat press treatment to apply pressure to the adhesive resin sheet in a layering direction of the first board and the second board under heat.

9 Claims, 13 Drawing Sheets

(56) References Cited

FOREIGN PATENT DOCUMENTS

| JP | H11-233946 A | 8/1999 |
| JP | 2000-307246 A | 11/2000 |
| JP | 2001-352138 A | 12/2001 |
| JP | 2003-133722 A | 5/2003 |
| JP | 2005-310871 A | 11/2005 |
| JP | 2006-313932 A | 11/2006 |
| JP | 2007-335701 A | 12/2007 |

* cited by examiner

METHOD FOR MANUFACTURING LAYERED CIRCUIT BOARD, LAYERED CIRCUIT BOARD, AND ELECTRONIC DEVICE

CROSS-REFERENCE TO RELATED APPLICATION

This application is based upon and claims the benefit of priority of the prior Japanese Patent Application No. 2011-253326, filed on Nov. 18, 2011, the entire contents of which are incorporated herein by reference.

FIELD

The embodiments discussed herein are related to a method for manufacturing a layered circuit board, a layered circuit board, and an electronic device.

BACKGROUND

A layered circuit board includes a plurality of boards which are stacked. Commonly, conductor pads which are connected with wiring layers are respectively provided to these boards. As a method for layering these boards, such method is widespread that a via is formed in an insulation layer interposed between boards so as to electrically connect conductor pads of boards through the via. Specifically, a plurality of via holes which penetrate in a thickness direction are formed with a laser or a drill, for example, in an adhesive resin sheet made of prepreg or the like. Then, these via holes are filled with conductive paste and the adhesive resin sheet filled with the conductive paste is interposed between a first board and a second board. Subsequently, processing of pressurizing in a layering direction under heating, referred to below as "heat press treatment", is performed. Accordingly, the conductor pads respectively formed in the first board and the second board are electrically connected with each other through a via and the first board and the second board are layered on each other.

FIG. 21 illustrates a layered circuit board of related art. As depicted in FIG. 21, an adhesive resin sheet 3 of which a via hole is filled with conductive paste 2 is used in a layered circuit board of related art. This adhesive resin sheet 3 is interposed between a pair of boards 4. FIG. 21 illustrates a state before heat press treatment is performed. Conductor pads 6 which are respectively formed on bonding faces 5 of the boards 4 are protruded from the bonding faces 5 by the thickness thereof. Therefore, an inter-conductor gap 7 is formed between the conductor pads 6 which are adjacent to each other in a planar direction (in-plane direction) of the boards 4.

The inter-conductor gap 7 functions as a space to which softened resin of the adhesive resin sheet 3 may move when the heat press treatment is performed. Thus, resin contained in the adhesive resin sheet 3 is softened to flow into the inter-conductor gap 7 in the heat press treatment. Accordingly, the adhesive resin sheet 3 is easily deformed. As a result, metal particles contained in the conductive paste 2 are easily pressurized, improving an aggregation state of the metal particles.

Japanese Laid-open Patent Publication No. 1995-176846, Japanese Laid-open Patent Publication No. 1987-243395, Japanese Laid-open Patent Publication No. 2005-310871, and Japanese Laid-open Patent Publication No. 2007-335701 are examples of related art.

SUMMARY

According to an aspect of the invention, a manufacturing method of a layered circuit board in which a first board and a second board are layered, the manufacturing method includes arranging an adhesive resin sheet on the first board so that one face faces the first board, the adhesive resin sheet including a plurality of variant via holes, an opening area on the one face of each of the plurality of variant via holes being larger than an opening area on the other face, filling the variant via holes with conductive paste, arranging the second board on the other face of the adhesive resin sheet after the filling with the conductive paste, and performing heat press treatment to apply pressure to the adhesive resin sheet in a layering direction of the first board and the second board under heat.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 21:
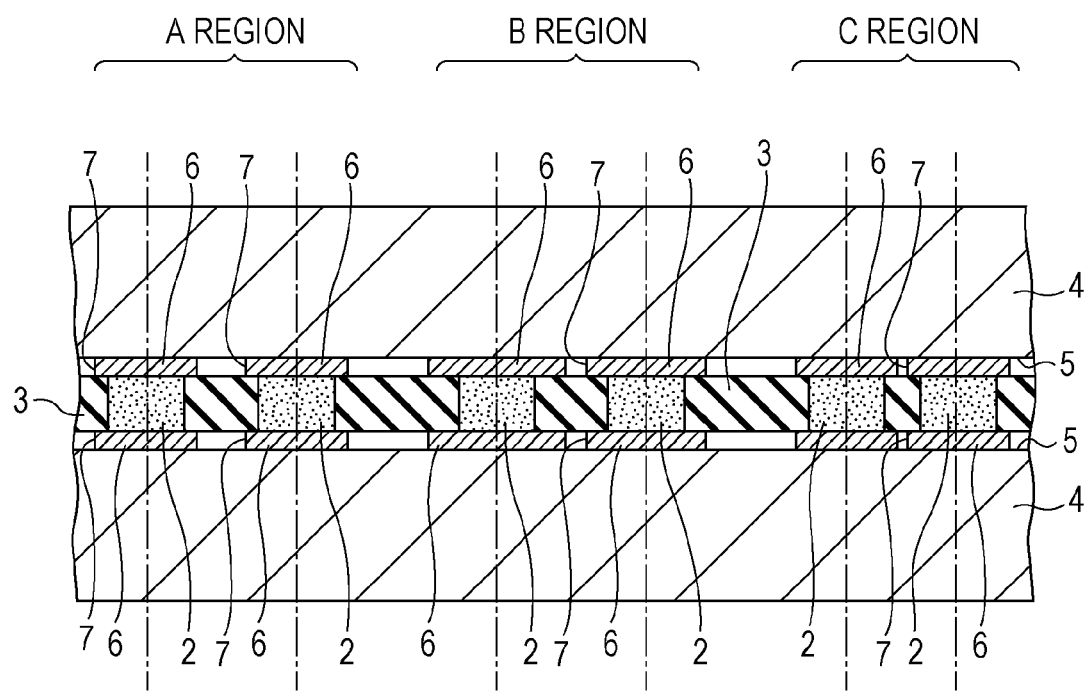
FIG. 21 illustrates a state in which an adhesive resin sheet in which a via hole is filled with conductive paste is interposed between a pair of boards in a layering process of a layered circuit board of related art.

However, in a layered circuit board, all areas occupied by conductive parts per unit area, referred to below as a "conductor area rate", are not uniform in a board plane. Here, the above-mentioned conductor part includes not only a conductor pad but also a wiring pattern and the like. In the example of FIG. 21, a pitch between the conductor pads 6 in B region is same as that in A region, but the size of the conductor pads 6 of B region is larger than that of A region. The size of the conductor pads 6 of C region is same as that of A region, but a pitch between the conductor pads 6 in C region is smaller than that of A region. As a result, conductor area rates of B region and C region are higher than that of A region.

In a planar direction of a board, a volume of the inter-conductor gap 7, to which softened resin may move, of a region with high conductor area rate is relatively smaller than that of a region with low conductor area rate. Accordingly, it is difficult to sufficiently deform the adhesive resin sheet 3 in the heat press treatment. On the other hand, in a region in which a conductor area rate is low, a volume of the inter-conductor gap 7, to which softened resin may move, is large, so that the adhesive resin sheet 3 is easily deformed in the heat press treatment. Thus, regions in which the adhesive resin sheet 3 is easily deformed and regions in which the adhesive resin sheet 3 is not easily deformed are mixed in the board planar direction. As a result, metal particles contained in the conductive paste 2 are insufficiently aggregated in regions with low conductive area rate. Accordingly, open failure of a via, that is electrical disconnection, may arise.

Therefore, it is preferable to provide a layered circuit board which may suppress connection failure of a via and a method for manufacturing the layered circuit board.

A layered circuit board and a method for manufacturing the layered circuit board according to embodiments of the present disclosure, referred to below as embodiments, are described below with reference to the accompanying drawings.

<Embodiment 1>

Figure 1:
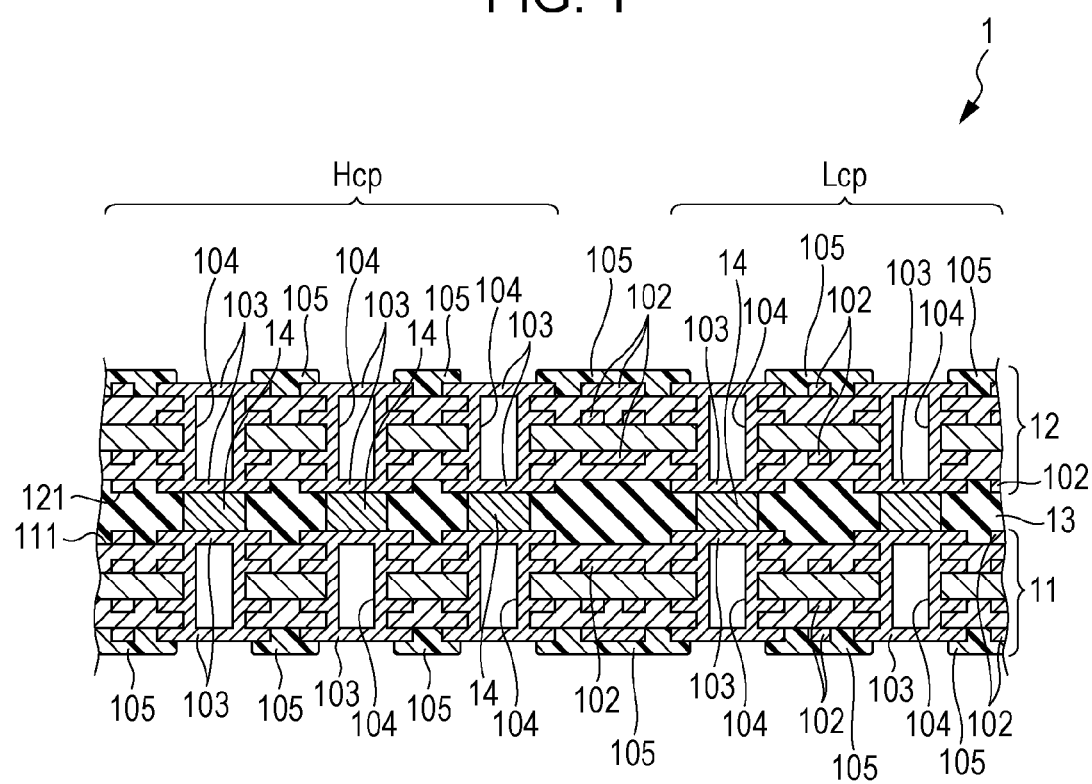
FIG. 1 is a partial-sectional view illustrating a layered circuit board according to Embodiment 1.

FIG. 1 is a partial-sectional view illustrating a layered circuit board 1 according to Embodiment 1. The layered circuit board 1 includes a first board 11, a second board 12, and an insulation layer 13 which is interposed between the first board 11 and the second board 12. Each of the first board 11 and the second board 12 is a multi-layer board obtained by layering a plurality of insulation boards provided with a wiring pattern 102 formed on surfaces thereof. The insulation board of the first board 11 and the second board 12 is obtained by hardening prepreg in a half-cured (B stage) state, which is obtained by impregnating a base material such as glass fiber cloth with insulating resin such as epoxy resin, by heat press treatment. The combination of a base material and insulating resin used for prepreg is not limited to the above-described example, but various combinations may be employed.

The wiring patterns 102 are made of a conductor such as copper and respectively have desired shapes. On surfaces of the first board 11 and the second board 12, conductor pads 103, sometimes referred to as "lands", are formed. The conductor pad 103 is made of a conductor such as copper as is the case with the wiring pattern 102.

The wiring patterns 102 in the first board 11 and the second board 12 are electrically connected with each other via the conductor pads 103 and through hole vias 104 thereof. The through hole via 104 is formed by applying copper plating, for example, to an inner wall of a through hole penetrating through an insulation board 101 so as to three-dimensionally connect the wiring patterns 102. However, the through hole via 104 is not limited to this. The through hole via 104 may be formed by filling a through hole with conductive paste containing silver powder or copper powder, instead of copper plating or in addition to copper plating, for example.

In the example of FIG. 1, the second board 12 is layered above the first board 11 so as to sandwich the insulation layer 13 with the first board 11. Among respective surfaces of the first board 11 and the second board 12, surfaces close to the insulation layer 13 are respectively referred to below as bonding faces 111 and 121. The bonding face 111 of the first board 11 and the bonding face 121 of the second board 12 are bonded to each other with the insulation layer 13 interposed. On the other hand, on surfaces positioned away from the insulation layer 13 among respective surfaces of the first board 11 and the second board 12, solder resists 105 are respectively formed as over-coat layers so as to cover the wiring patterns 102. The solder resist 105 is made of insulating resin of an epoxy type, an acrylic type, a polyimide type, or the like, or mixed resin of these types. The solder resist 105 may be photosensitive resin or thermosetting resin.

The insulation layer 13 interposed between the first board 11 and the second board 12 is now described. The insulation layer 13 is formed by hardening an adhesive resin sheet in a half-cured (B stage) state, which is obtained by impregnating a base material such as glass fiber cloth with thermosetting insulating resin such as epoxy resin, by heat press treatment. On a predetermined position of the insulation layer 13, a via 14 is formed. The via 14 electrically connects the conductor pad 103 (a first conductor pad) formed on the bonding face 111 of the first board 11 and the conductor pad 103 (a second conductor pad) formed on the bonding face 121 of the second board 12. The via 14 is formed in a manner such that a via hole which is a through hole penetrating through an adhesive resin sheet in the thickness direction is formed and conductive paste filling this via hole is hardened (solidified) as described later.

Apparent from FIG. 1, conductor patterns (conductor portions) formed on respective bonding faces 111 and 121 of the first board 11 and the second board 12 are not uniform in a board planar direction (plane expanding direction) of the layered circuit board 1. Here, the board planar direction of the layered circuit board 1 indicates a direction orthogonal to a layering direction of the layered circuit board 1. In this specification, the above-mentioned conductor pattern includes the conductor pads 103 and the wiring patterns 102 that are formed on the bonding faces 111 and 121.

In planar regions of the bonding faces 111 and 121, a region in which a conductor area rate Rcp which is an occupied area of a conductor pattern per unit area of the bonding faces 111 and 121 is equal to or larger than a reference ratio Rcpb is defined as a conductor high-density region Hcp. Further, in the planar regions of the bonding faces 111 and 121, a region in which the conductor area rate Rcp is lower than the reference ratio Rcpb is defined as a conductor low-density region Lcp. The conductor area rate Rcp may be paraphrased into a ratio of an area that the conductor pattern occupies in the whole or a predetermined region of the bonding faces 111 and 121.

Figure 2:
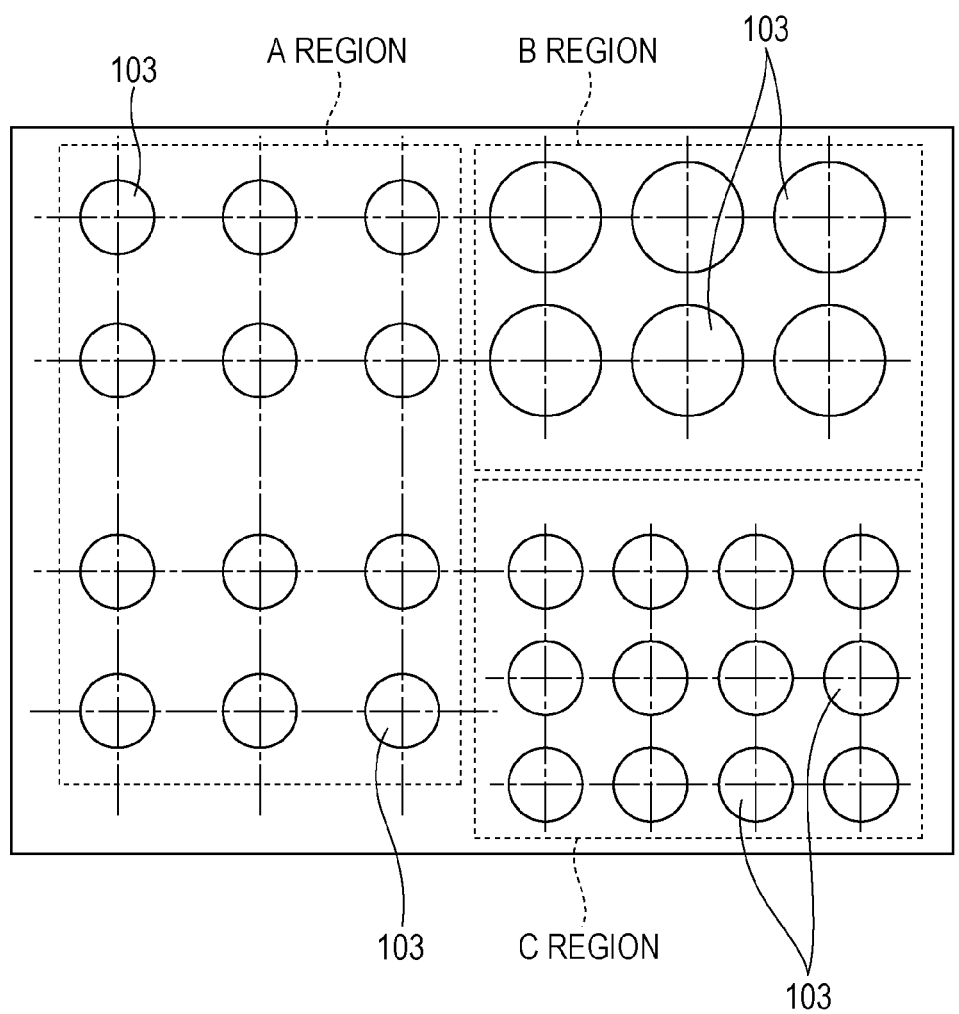
FIG. 2 schematically illustrates an arrangement pattern example of conductor pads according to Embodiment 1.

FIG. 2 schematically illustrates an arrangement pattern example of the conductor pads 103 in the board planar direction of the layered circuit board 1. As depicted in FIG. 2, when regions A to C respectively surrounded by dashed lines are compared to each other, a pitch of the conductor pads 103 of B region is same as that of A region but an area per conductor pad 103, referred to below as a "pad size", of B region is larger than that of A region. Further, the pad size of the conductor pad 103 of C region is identical to that of A region but the pitch of the conductor pads 103 of C region is narrower than that of A region. As a result, the conductor area rates Rcp of B region and C region are higher than the conductor area rate Rcp of A region. When a region with a high conductor area rate Rcp of the bonding faces 111 and 121 and a region with a low conductor area rate Rcp are mixed in the board planar direction of the layered circuit board 1, electrical connection failure easily occurs in the via 14 in layering of the first board 11 and the second board 12. This is because of the following reasons. The adhesive resin sheet is not easily squashed or deformed in the conductor high-density region Hcp in heat press treatment and the open failure of the via 14 easily occurs due to insufficient binding of metal particles of the conductive paste. On the other hand, when a filling amount of the conductive paste is increased so as to avoid the open failure, short circuit failure easily occurs in the via 14 in the conductor low-density region Lcp. Here, FIG. 2 merely illustrates the arrangement pattern of the conductor pads 103 as an example in order to describe the conductor area rate Rcp, and the shape of the arrangement pattern is not limited to the configuration of FIG. 2.

Figure 3:
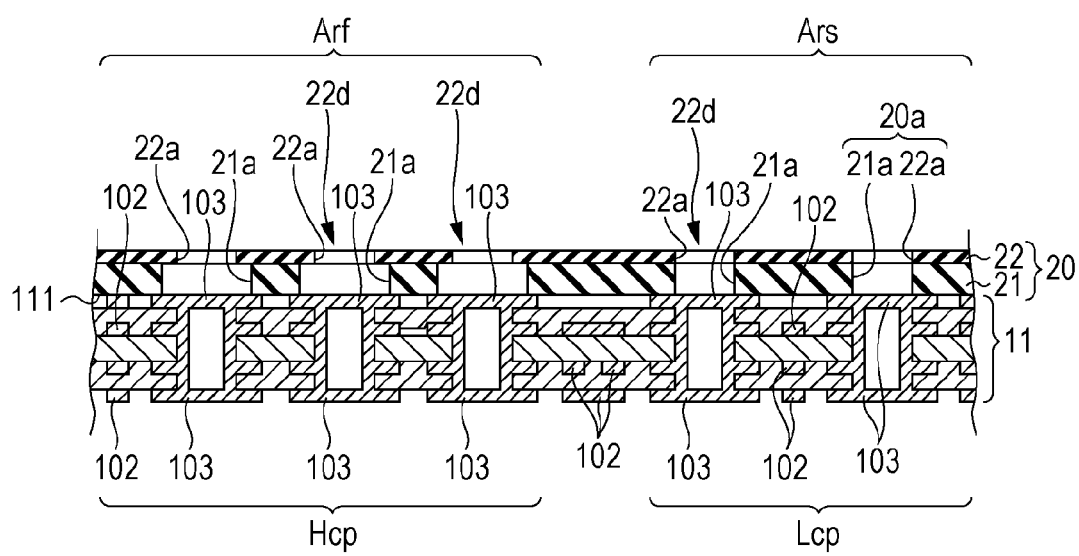
FIG. 3 illustrates a state where an adhesive resin sheet is disposed on a first board in a manufacturing method of a layered circuit board according to Embodiment 1.
Figure 4:
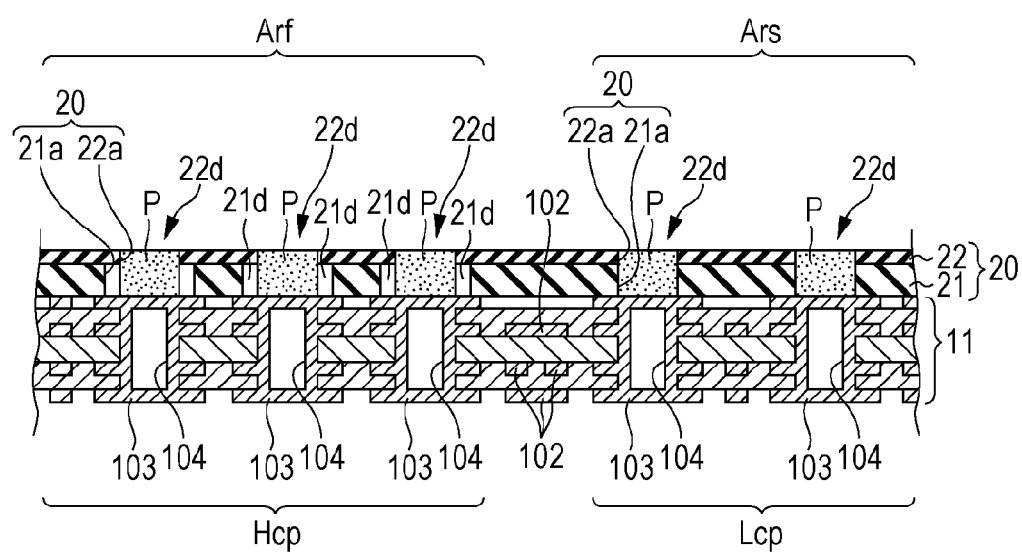
FIG. 4 illustrates a state in which a via hole is filled with conductive paste in the manufacturing method of a layered circuit board according to Embodiment 1.
Figure 5:
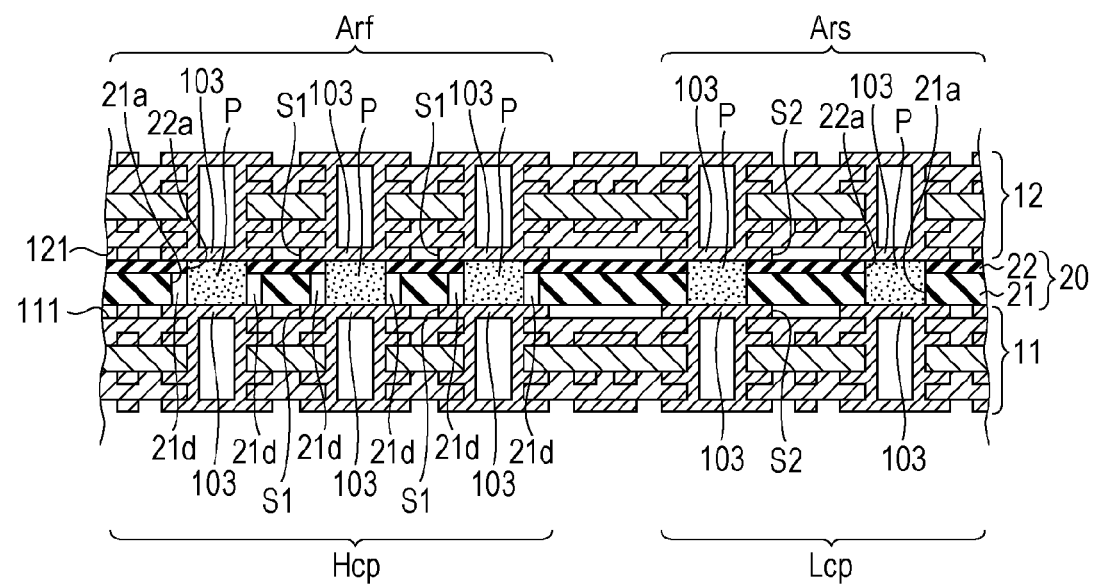
FIG. 5 illustrates a state in which a second board is disposed on the adhesive resin sheet in the manufacturing method of a layered circuit board according to Embodiment 1.
Figure 6:
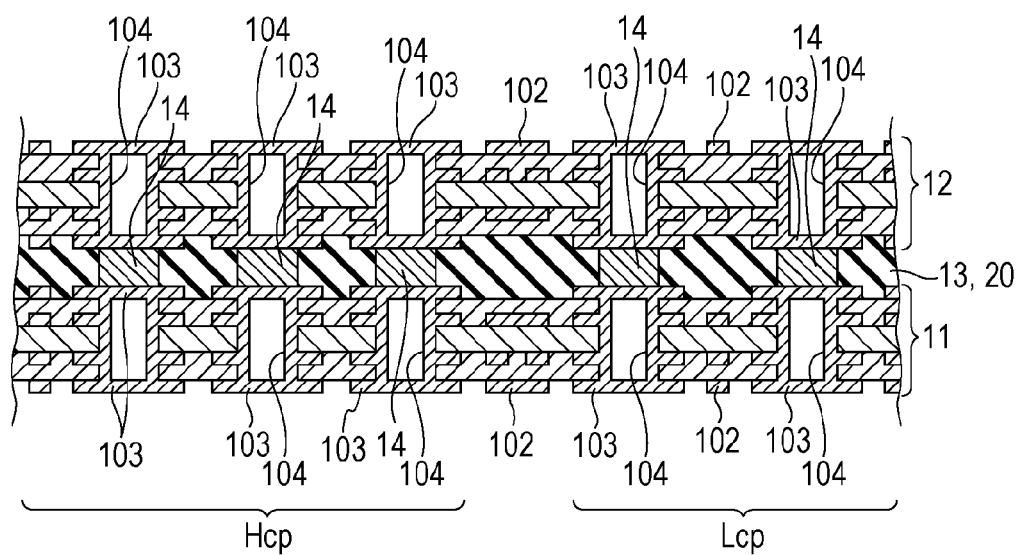
FIG. 6 illustrates a state in which heat press treatment is performed in the manufacturing method of a layered circuit board according to Embodiment 1.

A layering process of the layered circuit board 1 according to embodiment 1 is now described in detail with reference to the accompanying drawings. In the layering process of the layered circuit board 1, the first board 11 and the second board 12 are bonded to each other so as to be layered. FIGS. 3 to 6 illustrate the layering process of the layered circuit board 1. FIG. 3 illustrates a state in which an adhesive resin sheet 20 is disposed on the first board 11. FIG. 4 illustrates a state in which a via hole is filled with conductive paste P. FIG. 5 illustrates a state in which the second board 12 is disposed on the adhesive resin sheet 20. FIG. 6 illustrates a state in which heat press treatment is performed. For manufacturing of the layered circuit board 1, the above-described first board 11 and second board 12 are first prepared. The first board 11 and the second board 12 may be manufactured by various types of methods of related art such as a batch lamination method, for example.

As depicted in FIG. 3, the adhesive resin sheet 20 is an adhesive sheet containing insulating resin and is formed by bonding a first adhesive resin sheet 21 and a second adhesive resin sheet 22, which are separately prepared, to each other. The thickness of the first adhesive resin sheet 21 is larger than the thickness of the second adhesive resin sheet 22.

The first adhesive resin sheet 21 and the second adhesive resin sheet 22 are made of prepreg in a half-cured (B stage) state, which is obtained by impregnating a base material such as glass fiber cloth with thermosetting insulating resin such as epoxy resin, for example. However, the first adhesive resin sheet 21 and the second adhesive resin sheet 22 do not have to contain a base material. For example, the first adhesive resin sheet 21 may be made of above-mentioned prepreg and the second adhesive resin sheet 22 thinner than the first adhesive resin sheet 21 may be formed as a sheet member which is obtained by shaping thermosetting insulating resin in a half-cured state. For example, the thickness of the first adhesive resin sheet 21 is approximately 50 μm and the thickness of the second adhesive resin sheet 22 is approximately 20 μm. However, the thickness of respective adhesive resin sheets 21 and 22 is not limited to these and may be other value. Further, the second adhesive resin sheet 22 may be made of half-cured prepreg which is obtained by impregnating a base material with thermosetting insulating resin, as is the case with the first adhesive resin sheet 21.

The base material of the adhesive resin sheet 20 may have various forms such as cloth, mesh, and non-woven cloth. The base material of the adhesive resin sheet 20 is not limitedly made of glass fiber cloth but may be made of other materials such as aramid fiber cloth. Further, insulating resin of the adhesive resin sheet 20 is not limited to epoxy resin, but polyimide resin or the like may be employed, for example. The insulating resin used for the first adhesive resin sheet 21 and the insulating resin used for the second adhesive resin sheet 22 may be same or different in type.

A via hole which is a through hole penetrating through the adhesive resin sheet 20 in the thickness direction is next formed in the adhesive resin sheet 20. The adhesive resin sheet 20 is formed by layering the first adhesive resin sheet 21 and the second adhesive resin sheet 22 that are separately formed. A first via hole 21a is formed in the first adhesive resin sheet 21 and a second via hole 22a is formed in the second adhesive resin sheet 22. In this embodiment, a planar cross sectional shape of the first via hole 21a and the second via hole 22a is a circular shape. However, the shape of the planar cross sectional shape is not limited to this, but other shape may be employed. Here, in this specification, a "planar cross section" indicates a cross section in a direction along the planar direction (plane expanding direction) of the layered circuit board 1.

As a hole-forming method for forming the first via hole 21a and the second via hole 22a, an abrasion process using a laser, a cutting process using a drill, a punching process using a punching die, or the like may be arbitrarily employed, for example. Further, examples of the laser may include a UV-YAG laser, a carbon dioxide laser, an excimer laser, and the like.

As depicted in FIG. 3, the adhesive resin sheet 20 is disposed on the first board 11 by layering the first adhesive resin sheet 21 and the second adhesive resin sheet 22 in this order. Specifically, the first adhesive resin sheet 21 is positioned and temporarily attached on the first board 11 and the second adhesive resin sheet 22 is further positioned on the first adhesive resin sheet 21 so as to be bonded. Forming positions of the via holes 21a and 22a are respectively adjusted so that the first via hole 21a, the second via hole 22a, and the conductor pad 103 of the first board 11 are positioned in a concentric fashion, when the adhesive resin sheet 20 is disposed on the first board 11.

In a planar region of the adhesive resin sheet 20 in a state to be interposed between the bonding faces 111 and 121 of the first board 11 and the second board 12, a region corresponding to the above-mentioned conductor high-density region is defined as a "first region Arf". On the other hand, a region other than the first region Arf in the planar region of the adhesive resin sheet 20, that is, a region corresponding to the conductor low-density region is defined as a "second region Ars". Here, the above-mentioned "corresponding to the conductor high-density region Hcp (conductor low-density region Lcp)" indicates a state in which the adhesive resin sheet 20 is overlapped with the conductor high-density region Hcp (conductor low-density region Lcp) in the vertical direction when the adhesive resin sheet 20 is interposed between the bonding faces 111 and 121.

An opening diameter, referred to below as a "first via diameter", of the first via hole 21a formed in the first adhesive resin sheet 21 and an opening diameter, referred to below as a "second via diameter", of the second via hole 22a formed in the second adhesive resin sheet 22 are now described. The second via diameter is set to a first setting value Rv1 which is predetermined in both of the first region Arf and the second region Ars in the second adhesive resin sheet 22. This first setting value Rv1 is a design value with respect to the diameter of the via 14 to be formed in the layered circuit board 1. In this example, it is assumed that design values of via diameters of vias 14 formed any positions are equal to each other for the sake of simplicity. Accordingly, the second via diameters of all of the second via holes 22a are same as each other in the second adhesive resin sheet 22. The first setting value Rv1 is approximately 0.15 mm, for example. However, the first setting value Rv1 is not limited to this, but may be other value. Further, a value of the first setting value Rv1 may be changed in accordance with a position in the plane of the second adhesive resin sheet 22.

The first via diameter of the first via hole 21a is now described. In the hole-forming process of the first via hole 21a with respect to the first adhesive resin sheet 21, the first via diameter varies in accordance with whether the position of the first via hole 21a belongs to the first region Arf or the second region Ars. For example, in the second region Ars of the adhesive resin sheet 20, the first via diameter is set to the first setting value Rv1 described above. Accordingly, in the second region Ars of the first adhesive resin sheet 21, the first via hole 21a and the second via hole 22a are formed as through holes having the same diameters as each other. On the other hand, in the first region Arf of the first adhesive resin sheet 21, the first via diameter is set to a second setting value Rv2 which is larger than the first setting value Rv1. As a result, in the first region Arf of the first adhesive resin sheet 21 (lower layer sheet portion), the first via hole 21a (first through hole) having a larger via diameter than that of the second via hole 22a (second through hole) of the second adhesive resin sheet 22 (upper layer sheet portion) is formed. In other words, the first adhesive resin sheet 21 (lower layer sheet portion) has a plurality of first via holes 21a (first through holes) having the second setting value Rv2 (first cross section area) in the first region Arf. The second adhesive resin sheet 22 (upper layer sheet portion) has a plurality of second via holes 22a (second through holes) having the first setting value Rv1 (second cross section area) which is smaller than the second setting value Rv2, in the first region Arf. The second setting value Rv2 is approximately 0.30 mm, for example. However, the second setting value Rv2 is not limited to this, but may be other value.

As described above, in the adhesive resin sheet 20, a plurality of variant via holes of which an opening area on one face (a lower face of the first adhesive resin sheet 21) is larger than an opening area on the other face (an upper face of the second adhesive resin sheet 22) are formed in the first region Arf. The variant via hole here is formed to include the second via hole 22a and the first via hole 21a having a larger via diameter than that of the second via hole 22a. The first via hole 21a is an example of the first through hole and the second via hole 22a is an example of the second through hole. Further, the first adhesive resin sheet 21 is an example of the lower layer sheet portion and the second adhesive resin sheet 22 is an example of the upper layer sheet portion.

The first adhesive resin sheet 21 and the second adhesive resin sheet 22 are subsequently disposed on the first board 11 in sequence (refer to FIG. 3). At that time, the first adhesive resin sheet 21 and the second adhesive resin sheet 22 are disposed to superposed on each other so that the center of the first via hole 21a of the first adhesive resin sheet 21 and the center of the second via hole 22a of the second adhesive resin sheet 22 are vertically overlapped with each other. Accordingly, when the whole of the adhesive resin sheet 20 is considered, a face in which the via diameter is relatively larger is disposed to face the bonding face 111 of the first board 11 in the first region Arf. A charging port 22d of the conductive paste P is formed on the upper end of the second via hole 22a which is formed in the second adhesive resin sheet 22, and the conductive paste P is charged from this charging port 22d to fill the via holes 21a and 22a (refer to FIG. 4). In this embodiment, the conductive paste P is charged by employing a screen printing method using a squeegee (not depicted), but the filling is not limited to this method. Further, in order to avoid contamination of a surface of the second adhesive resin sheet 22 in filling of the conductive paste P, a polyethylene terephthalate (PET) film to which a silicone type releasing agent, for example, is applied is bonded on the upper face of the second adhesive resin sheet 22. This PET film may be peeled off after the filling of the conductive paste P is finished.

The conductive paste P contains metal particles (conductive filler) and liquid binder resin in which the metal particles are dispersed. In Embodiment 1, copper powder is used as metal particles, but metal particles are not limited to this. As the metal particles, gold, silver, palladium, nickel, tin, lead, and the like as well as copper may be used and two or more kinds of metal particles may be combined to be used, for example. As the binder resin, thermosetting resin such as epoxy resin is used, for example. However, the binder resin is not limited to this, but may be other resin such as polyimide resin, for example. The conductive paste P is obtained by kneading liquid binder resin and metal particles.

The conductive paste P may contain not only the binder resin and the metal particles but also flux and the like, for example.

Apropos, the conductive paste P has viscosity to some extent, so that a filling amount of the conductive paste P which is charged for filling from one charging port 22d in association with a squeegeeing operation of the squeegee, for example, depends on a planar cross sectional area of the charging port 22d (second via hole 22a).

In the second region Ars of the adhesive resin sheet 20, the first via diameter of the first via hole 21a is equal to the second via diameter of the second via hole 22a. Accordingly, as depicted in FIG. 4, an inner space of a pair of via holes 21a and 22a (also referred to below merely as a "via hole 20a" when the via holes 21a and 22a are collectively called) is filled with the conductive paste P in the second region Ars.

On the other hand, in the first region Arf of the adhesive resin sheet 20, the first via diameter of the first via hole 21a is larger than the second via diameter of the second via hole 22a. Accordingly, in the first via hole 21a formed in the first adhesive resin sheet 21, a space 21d which is not filled with the conductive paste P is formed in a portion which is not vertically overlapped with the charging port 22d which is formed on the second via hole 22a of the second adhesive resin sheet 22. This space 21d is a space formed such that when the conductive paste P is charged from the charging port 22d, the conductive paste P is not fully charged. Hereinafter, the space 21d is referred to as a "hollow portion". The hollow portion 21d functions as a space into which insulating resin, which is to be softened in heat press treatment, of the adhesive resin sheet 20 moves or is allowed to escape, as described later. The hollow portion 21d is formed in the first region Arf in the planar region of the adhesive resin sheet 20 and is not formed in the second region Ars.

When filling of the via hole 20a with the conductive paste P is finished, the second board 12 is positioned to be disposed on the adhesive resin sheet 20 (specifically, on the second adhesive resin sheet 22 which is the upper layer), as depicted in FIG. 5. At this time, the second board 12 is positioned so that the conductor pad 103 formed on the bonding face 121 of the second board 12 is vertically overlapped, for example, in a concentric fashion, with the second via hole 22a of the second adhesive resin sheet 22.

Then, heat press, referred to below as "heat press treatment" as well, to apply pressure in a layering direction under heat is performed in a state in which the adhesive resin sheet 20 is interposed between the first board 11 and the second board 12. This heat press treatment may be performed with a hot press of related art which is not depicted, for example, a vacuum press machine. Heating temperature and pressure for the heat press treatment are arbitrarily determined in consideration of a property of the adhesive resin sheet 20, for example.

When the heat press treatment is started, a layered body including the first board 11, the adhesive resin sheet 20, and the second board 12 is heated. As a result, thermosetting insulating resin constituting the second adhesive resin sheet 22 and thermosetting insulating resin with which the base material of the first adhesive resin sheet 21 is impregnated are melted to be softened. The insulating resin, of which viscosity is decreased due to softening, of the adhesive resin sheet 20 flows into a gap space of the vicinity (refer to FIG. 6). In this embodiment, dynamic curing properties representing relationships between viscosity of insulating resin and a temperature of both of the binder resin and the insulating resin are adjusted so that the binder resin of the conductive paste P is softened later than the thermosetting insulating resin contained in the adhesive resin sheet 20.

Reference characters S (S1 and S2) of FIG. 5 denote "inter-conductor gap portions" which include a space formed between the conductor pads 103 of the bonding faces 111 and 121, a space formed between the conductor pad 103 and the wiring pattern 102, and a space formed between the wiring patterns 102. An inter-conductor gap portion formed in the conductor high-density region Hcp of the bonding faces 111 and 121 is denoted by "S1" and an inter-conductor gap portion formed in the conductor low-density region Lcp is denoted by "S2".

In a case where the inter-conductor gap portions S1 and S2 have sufficient spaces into which the thermosetting insulating resin flows when the adhesive resin sheet 20 is softened by the heat press treatment, the adhesive resin sheet 20 is easily squashed and thus the squashing amount is secured. Accordingly, the conductive paste P which fills the via hole 20a of the adhesive resin sheet 20 is sufficiently pressurized, so that an aggregating property of the metal particles is improved and the metal particles are favorably bound to each other. Subsequently, the thermosetting insulating region which is a binder component of the conductive paste P and the thermosetting insulating resin constituting the adhesive resin sheet 20 are cured to be integrated, forming the insulation layer 13. Thus, the via hole 20a and the metal particles, which aggregate to be bound to each other in the via hole 20a, of the conductive paste P form the via 14 with a cured binder component.

When volumes of the inter-conductor gap portions S1 and S2 depicted in FIG. 5 are compared to each other, the inter-conductor gap portion S1 formed in the conductor high-density region Hcp is smaller than the inter-conductor gap portion S2 formed in the conductor low-density region Lcp. Accordingly, in the conductor high-density region Hcp, there is a insufficient volume of the gap space into which the insulating resin to be melted and softened in the heat press treatment of the adhesive resin sheet 20 is moved or allowed to escape, so that it is difficult to sufficiently squash the adhesive resin sheet 20. As a result, pressure imposed on the conductive paste P from the top and bottom sides is decreased, easily causing insufficient aggregation and insufficient binding of metal particles contained in the conductive paste P.

On the other hand, according to the layered circuit board 1 of this embodiment, the hollow portion 21d may be preliminarily formed around the conductive paste P before the start of the heat press treatment by setting the first via diameter larger than the second via diameter in the first region Arf of the adhesive resin sheet 20. Therefore, insulating resin, which is softened by the heat press treatment, of the adhesive resin sheet 20 in the first region Arf flows to fill both of the inter-conductor gap portion S1 and the hollow portion 21d (refer to FIG. 6). Accordingly, a gap space into which softened insulating resin flows and which easily tends to become insufficient when a gap space is only the inter-conductor gap portion 51 may be made up by the hollow portion 21d which is formed in the first region Arf of the adhesive resin sheet 20.

As a result, even if density of conductor portions of the conductor pads 103 and the wiring patterns 102 which are formed on the bonding faces 111 and 121 is increased, the adhesive resin sheet 20 is easily squashed in the heat press treatment. Accordingly, the metal particles contained in the conductive paste P are easily pressurized and the aggregating property of the metal particles is enhanced. Consequently, the metal particles are favorably bound to each other, being able to suppress open failure of the via 14 which is formed in the conductor high-density region Hcp. Thus, the open failure of the via 14 may be suppressed in the conductor high-density region Hcp, so that a supplying amount of the conductive paste P per via 14 on one place does not have to be excessively increased. Therefore, the manufacturing cost of the layered circuit board 1 may be reduced and excessive supply of the conductive paste P with respect to the conductor low-density region Lcp may be avoided. Accordingly, the conductive paste P supplied to a via hole does not flow to other adjacent via holes and resulting short circuit failure of the via 14 may be suppressed in the conductor low-density region Lcp.

According to the layered circuit board 1, connection failure of the via 14 may be avoided even though a region with a high conductor area rate and a region with a low conductor area rate are mixed in the board planar direction, so that the yield of the layered circuit board 1 is improved, being able to contribute to improvement of productivity of the layered circuit board 1. Accordingly, the manufacturing cost of the layered circuit board 1 may be reduced.

Figure 7:
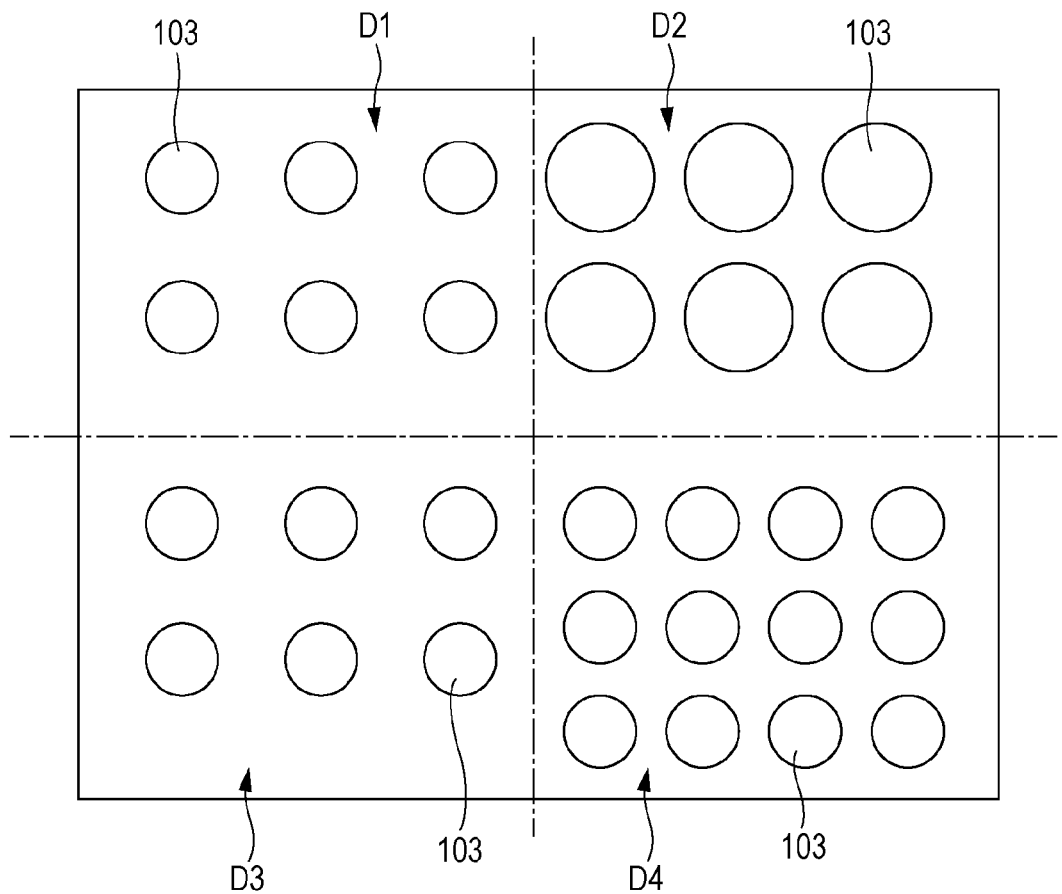
FIG. 7 illustrates a calculation method of a conductor area rate in the layered circuit board according to Embodiment 1.

With the above-described manufacturing method of the layered circuit board 1, the conductor area rate Rcp may be obtained by using CAD (computer aided design) design data regarding the layered circuit board 1, for example. For example, as depicted in FIG. 7, a planar region of the bonding face 111 (121) of the first board 11 (the second board 12) may be divided into a plurality of sectioned regions D1, D2, D3, D4, . . . , and the conductor area rate Rcp may be calculated for each of the sectioned regions. For example, the conductor area rate Rcp of the sectioned region D1 is calculated by dividing a sum of areas of the conductor pads 103 and the wiring patterns 102 that are formed in the sectioned region D1 by an area of the sectioned region D1. The board planar region is divided into the sectioned regions D1 to D4 in FIG. 7, but the number of sections is not limited to this. Further, the wiring pattern 102 is not depicted in FIG. 7.

Thus, the planar region of the layered circuit board 1 is divided into a plurality of sectioned regions and the conductor area rate Rcp is calculated for each of the bonding face 111 of the first board 11 and the bonding face 121 of the second board 12 for every sectioned region. For example, it may be determined that a sectioned region in which the conductor area rate Rcp is equal to or more than the reference ratio Rcpb in at least one of the bonding faces 111 and 121 is set to a conductor high-density region and a region in which the conductor area rate Rcp is not equal to or more than the reference ratio Rcpb is set to a conductor low-density region.

The reference ratio Rcpb is a threshold value of the conductor area rate Rcp at which it is determined that there is high possibility that binding failure of metal particles contained in the conductive paste P occurs due to an insufficient squashing amount of the adhesive resin sheet 20 in the heat press. In this embodiment, the reference ratio Rcpb is set to 70%. In a sectioned region in which the conductor area rate Rcp in the bonding face 111 or 121 is 70% or more in the planar region of the adhesive resin sheet 20, the hollow portion 21*d* is formed on at least any position in the first region Arf corresponding to the sectioned region. Accordingly, connection failure of the via 14 may be suppressed in the layered circuit board 1. Here, a specific value of the reference ratio Rcpb is not limited to 70% in this embodiment, but may be arbitrarily changed.

In this embodiment, a ratio between the first via diameter (an opening area on one face) of the first via hole 21*a* formed in the first region Arf of the adhesive resin sheet 20 and the second via diameter (an opening area on the other face) of the second via hole 22*a* is changed depending on a value of the conductor area rate Rcp of the adhesive resin sheet 20. In more detail, in a region with a higher conductor area rate Rcp of the adhesive resin sheet 20, difference between the first and second via diameters of the first via hole 21*a* and the second via hole 22*a* that form a variant via hole is set larger. Accordingly, as the conductor area rate Rcp in the conductor high-density region Hcp is higher, larger total volume of the hollow portions 21*d* formed in the first region Arf of the adhesive resin sheet 20 may be secured. By increasing the total volume of the hollow portions 21*d* formed in the first region Arf of the adhesive resin sheet 20, connection failure of the via 14 in the conductor high-density region Hcp may be favorably suppressed.

In this embodiment, the thickness of the first adhesive resin sheet 21 (lower layer sheet portion) is set to be larger than the thickness of the second adhesive resin sheet 22 (upper layer sheet portion), and these adhesive resin sheets 21 and 22 are layered to form the adhesive resin sheet 20. Accordingly, a rate that the thickness of the first adhesive resin sheet 21 occupies in the whole thickness of the adhesive resin sheet 20 is higher than a rate that the thickness of the second adhesive resin sheet 22 occupies. When the rate that the thickness of the first adhesive resin sheet 21 occupies in the whole thickness of the adhesive resin sheet 20 is increased in the first region Arf, the volume of the hollow portions 21*d* may be increased, advantageously suppressing connection failure of the via 14 in the conductor high-density region Hcp.

Here, the hollow portion 21*d* is formed by setting the first via diameter larger than the second via diameter in the first region Arf of the adhesive resin sheet 20 in Embodiment 1, but the hollow portion 21*d* may be formed in a separate process from the process of forming a via hole of the adhesive resin sheet 20.

(Layered Circuit Board After Layering)

Figure 8:
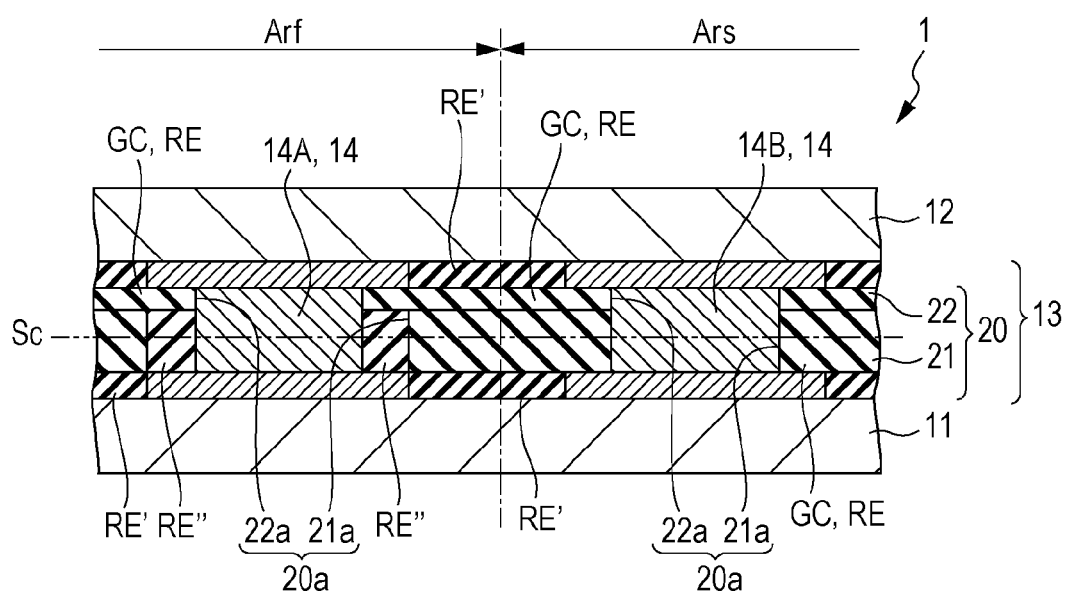
FIG. 8 schematically illustrates the peripheral configuration of a via in the layered circuit board according to Embodiment 1.

A configuration property of the layered circuit board 1 which is manufactured by the manufacturing method according to Embodiment 1 is described. The insulation layer 13 is formed by hardening the adhesive resin sheet 20 in the half-cured state by the heat press treatment and the conductive paste P charged to fill the via hole 20*a* is hardened to form the via 14. FIG. 8 schematically illustrates the peripheral configuration of the via 14 in the layered circuit board 1 according to Embodiment 1. FIG. 8 illustrates a state after the heat press treatment is finished. A via 14 (denoted by 14A in FIG. 8) belonging to the first region Arf of the insulation layer 13 is depicted on the left side of FIG. 8 and a via 14 (denoted by 14B in FIG. 8) belonging to the second region Ars is depicted on the right side of FIG. 8.

As described above, the hollow portion 21*d* is not formed in the second region Ars corresponding to the conductor low-density region Lcp in the bonding faces 111 and 121, in the manufacturing method of the layered circuit board 1. Accordingly, the second region Ars of the insulation layer 13 is sectioned into a region in which the via 14B is formed and a region in which glass fiber cloth GC and cured insulating resin RE of the adhesive resin sheet 20 are integrated, in a via cross section Sc on the height crossing a via. In the example illustrated in FIG. 8, a region of the via 14B and a region in which the glass fiber cloth GC and the cured insulating resin RE of the adhesive resin sheet 20 are integrated are defined by a wall surface of the via hole 20*a* (21*a* and 22*a*) of the adhesive resin sheet 20 as a boundary.

The region of the via 14B is formed at the inner side of the boundary and the region in which the glass fiber cloth GC and the cured insulating resin RE are integrated is formed at the outside of the boundary. A reference character RE' in FIG. 8 denotes insulating resin which is cured after moving from the adhesive resin sheet 20 to the inter-conductor gap portion S in the heat press treatment.

On the other hand, the hollow portion 21d (refer to FIG. 6) is formed in a part of the first region Arf in the adhesive resin sheet 20. Part of insulating resin, which is softened in the heat press treatment, of the adhesive resin sheet 20 moves to (flows into) the hollow portion 21d and then is cured. Since the glass fiber cloth GC which is the base material of the adhesive resin sheet 20 does not exist in the hollow portion 21d, a portion RE" in which the glass fiber cloth GC is not included and only cured insulating resin exists, referred to below as a "resin singularly-existing portion", is formed adjacent to a peripheral portion or periphery of the via 14. Further, adjacent to the peripheral portion of the resin singularly-existing portion RE", a region in which the glass fiber cloth GC and cured insulating resin are integrated is formed. In other words, the resin singularly-existing portion RE" is formed in a region which is sandwiched by the via 14 which is formed at the inner side of the wall surface of the second via hole 22a serving as a boundary and the glass fiber cloth GC which is formed at the outside of the wall surface of the first via hole 21a serving as a boundary.

As described above, a portion in which the hollow portion 21d is formed when the heat press treatment is started forms the resin singularly-existing portion RE" in which the glass fiber cloth GC of the adhesive resin sheet 20 does not exist and cured insulating resin exists, through the heat press treatment. Accordingly, the resin singularly-existing portion RE" which is formed in a part of the first region Arf of the insulation layer 13 may be a proof which confirms that the hollow portion 21d has existed in the adhesive resin sheet 20 before the heat press treatment, that is, the layered circuit board 1 is manufactured by the manufacturing method of this embodiment.

<Embodiment 2>

Figure 9A:
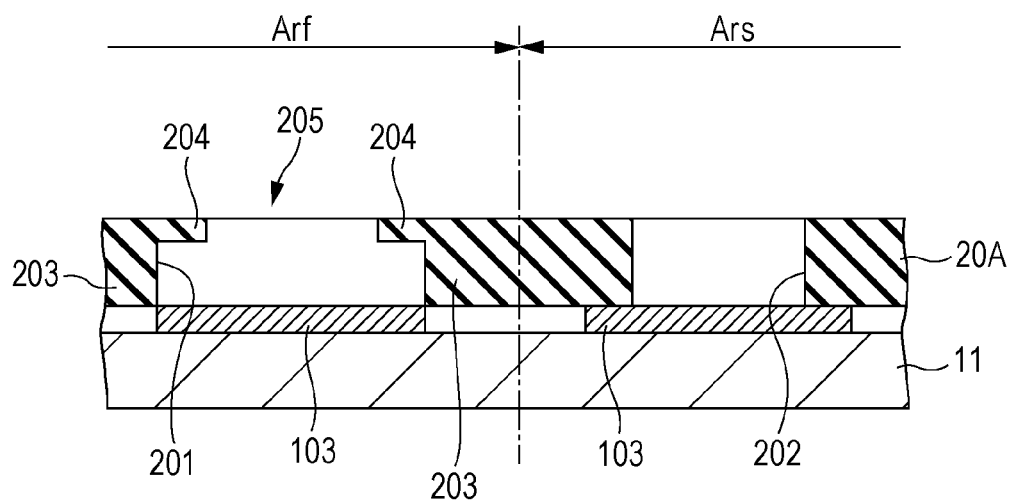
FIG. 9A illustrates an adhesive resin sheet according to Embodiment 2 and illustrates a state before a via hole of the adhesive resin sheet is filled with the conductive paste.
Figure 9B:
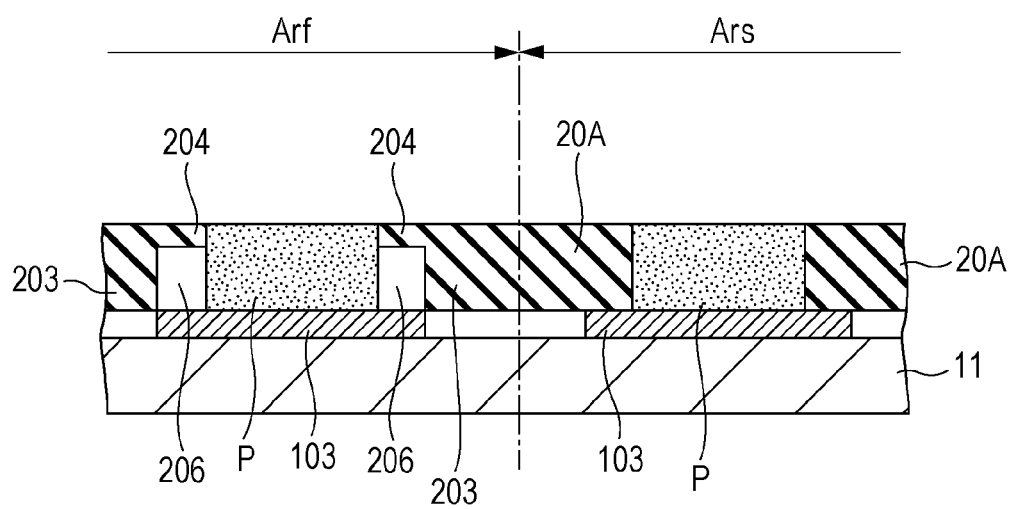
FIG. 9B illustrates modification of the adhesive resin sheet according to Embodiment 2 and illustrates a state after a via hole of the adhesive resin sheet is filled with the conductive paste.

Embodiment 2 is now described. FIGS. 9A and 9B illustrate an adhesive resin sheet 20A according to Embodiment 2. The adhesive resin sheet 20A is made of prepreg in a half-cured (B stage) state, which is obtained by impregnating a base material such as glass fiber cloth with thermosetting insulating resin such as epoxy resin. In FIG. 9A, a via hole 201 which is formed in the first region Arf of the adhesive resin sheet 20A is depicted on the left side and a via hole 202 which is formed in the second region Ars on the right side. FIGS. 9A and 9B illustrate a state where the adhesive resin sheet 20A is disposed on the first board 11. FIG. 9A illustrates a state before the via holes 201 and 202 of the adhesive resin sheet 20A are filled with the conductive paste P, and FIG. 9B illustrates a state after the via holes 201 and 202 are filled with the conductive paste P.

The second region Ars of the adhesive resin sheet 20A is first described. The via hole 202 formed in the second region Ars is a through hole which penetrates through the adhesive resin sheet 20A in the thickness direction. A planar cross sectional area in the via hole 202 does not change in the thickness direction of the adhesive resin sheet 20A. In the example of FIGS. 9A and 9B, the planar cross sectional shape of the via hole 202 is circular, but the shape is not limited to this and other shape may be employed. The diameter of the via hole 202 (via diameter) may be set to have the first setting value Rv1, for example, as is the case with the via diameter of the via hole 20a in Embodiment 1.

In the first region Arf of the adhesive resin sheet 20A, a lower layer sheet portion 203 and an upper layer sheet portion 204 of which respective via diameters in the via hole 201 are different from each other are formed in a manner to align in the thickness direction of the adhesive resin sheet 20A. In a state in which the adhesive resin sheet 20A is disposed on the first board 11, the lower layer sheet portion 203 forms a lower layer portion of the adhesive resin sheet 20A and the upper layer sheet portion 204 forms an upper layer portion of the adhesive resin sheet 20A. As depicted in FIGS. 9A and 9B, the adhesive resin sheet 20A includes a variant via hole of which an opening area on one face which is arranged to oppose the first board 11 is larger than an opening area on the other face.

In the via hole 202, a planar cross sectional shape of a portion formed in the upper layer sheet portion 204, referred to below as an "upper layer via hole portion", and a planar cross sectional shape of a portion which is formed in the lower layer sheet portion 203, referred to below as a "lower layer via hole portion", have concentric circular shapes of which respective diameters are different from each other. A stepped portion is formed on via diameters at a boundary of the upper layer via hole portion and the lower layer via hole portion. The via diameter of the lower layer via hole portion is larger than the via diameter of the upper layer via hole portion. For example, the via diameter of the upper layer via hole portion of the via hole 201 may be set to have the first setting value Rv1 as is the case with the via hole 202 and the via diameter of the lower layer via hole portion may be set to have the above-described second setting value Rv2.

As the hole-forming method of the via hole 202 in the second region Ars, a method of processing with a laser, a method of processing with a drill, or a punching process, for example, may be arbitrarily selected as is the case with Embodiment 1. The lower layer via hole portion and the upper layer via hole portion of which respective via diameters are different from each other are concentrically formed in the via hole 201 in the first region Arf, so that it is preferable to employ the method of processing with a laser which facilitates the hole-forming process.

As depicted in FIG. 9B, in the second region Ars of the adhesive resin sheet 20A, the via diameter of the via hole 202 does not change in the thickness direction. Accordingly, when the conductive paste P is supplied from an opening end of the via hole 202 by the screen printing method, for example, the whole of the via hole 202 is filled with the conductive paste P, forming no hollow portion. On the other hand, in the first region Arf of the adhesive resin sheet 20A, the via diameter of the lower layer via hole portion is larger than the via diameter of the upper layer via hole portion. Accordingly, a hollow portion 206 which is not filled with the conductive paste P is formed at a portion, which is not overlapped with a charging port 205 which is formed on the opening end of the upper via hole portion, in the lower via hole portion. Therefore, insulating resin of the adhesive resin sheet 20A is supplied to fill the hollow portion 206 in the conductor high-density region Hcp of the layered circuit board 1 as well in the heat press treatment, so that the adhesive resin sheet 20A is easily squashed in the thickness direction. Accordingly, metal particles contained in the conductive paste P may be favorably bound to each other in the heat press treatment, being able to suppress connection failure of the via 14.

Figure 10A:
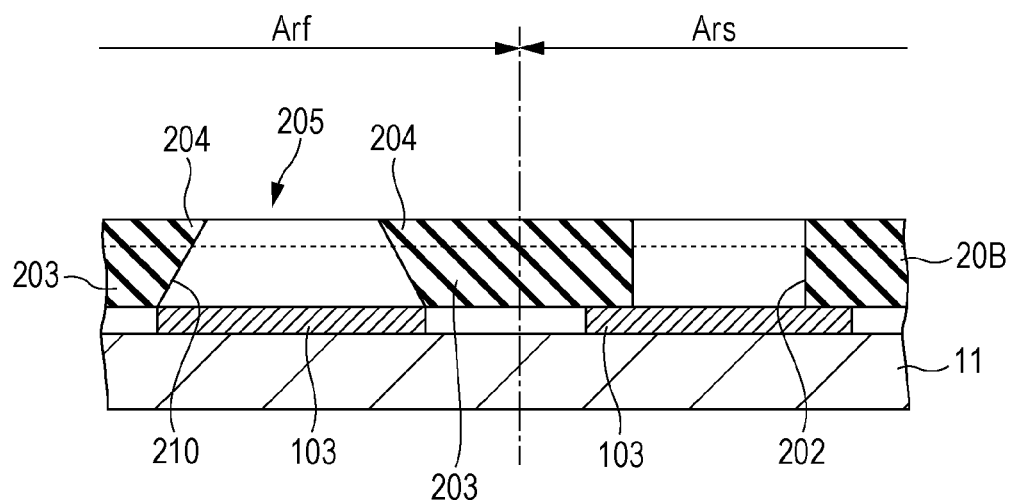
FIG. 10A illustrates modification of the adhesive resin sheet according to Embodiment 2 and illustrates a state before a via hole of the adhesive resin sheet is filled with the conductive paste.
Figure 10B:
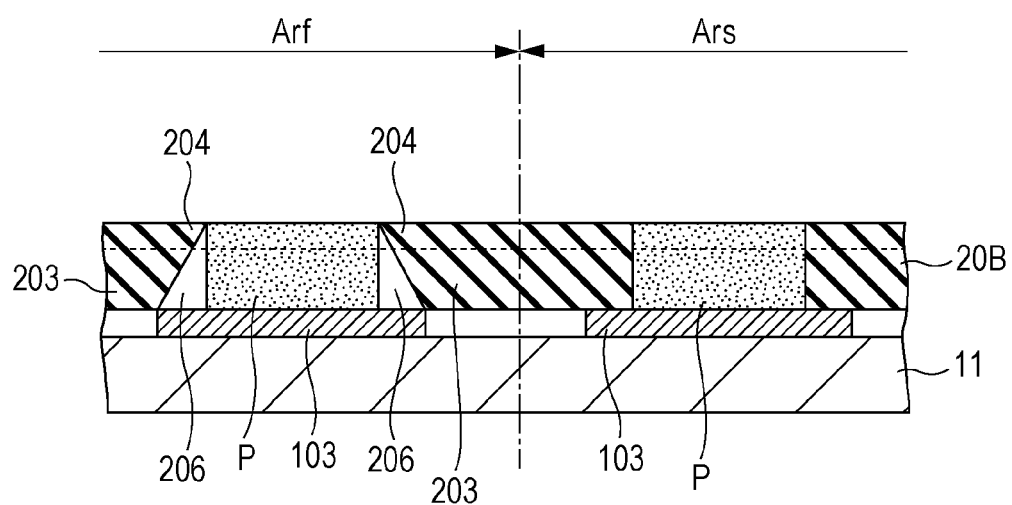
FIG. 10B illustrates the adhesive resin sheet according to Embodiment 2 and illustrates a state after a via hole of the adhesive resin sheet is filled with the conductive paste.

A modification of the adhesive resin sheet is now described with reference to FIGS. 10A and 10B. In an adhesive resin sheet 20B depicted in FIGS. 10A and 10B, a shape of a via hole 210 which is formed in the first region Arf is different from that illustrated in FIGS. 9A and 9B. The via hole 202 which is formed in the second region Ars is common to that of the adhesive resin sheet 20A, so that the detailed description thereof is omitted. The adhesive resin sheet 20B depicted in FIGS. 10A and 10B is disposed on the first board 11. FIG. 10A illustrates a state before a via hole of the adhesive resin sheet 20B is filled with the conductive paste P, and FIG. 10B illustrates a state after the via hole of the adhesive resin sheet 20B is filled with the conductive paste P.

The via hole 210 which is formed in the first region Arf of the adhesive resin sheet 20B has a taper shape in which a via diameter gradually narrows from a lower face (one face), which faces the first board 11, of the adhesive resin sheet 20B toward an upper face (the other face) in a state in which the adhesive resin sheet 20B is disposed on the first board 11. In FIGS. 10A and 10B, the lower layer sheet portion 203 forming the lower layer of the adhesive resin sheet 20B and the upper layer sheet portion 204 forming the upper layer are defined by a virtual line depicted by a dashed line.

In the first region Arf of the adhesive resin sheet 20B, even though the via hole 210 is formed to have the taper shape, the via diameter of the lower layer via hole portion of the lower layer sheet portion 203 may be set larger than that of the upper layer via hole portion of the upper layer sheet portion 204, as depicted in FIGS. 10A and 10B. As a result, a hollow portion 206 is formed in a portion, which is not overlapped with the charging port 205 which is formed on an opening end of the upper layer via hole portion, in the lower layer via hole portion, as is the case with the adhesive resin sheet 20A. Accordingly, metal particles contained in the conductive paste P may be favorably bound to each other in the conductor high-density region of the layered circuit board 1 as well in the heat press treatment, being able to suppress electrical connection failure of the via 14.

As described above, the adhesive resin sheet applied to the layered circuit board 1 may be integrally formed without layering the first adhesive resin sheet 21 and the second adhesive resin sheet 22 which are separately formed, unlike Embodiment 1. However, according to the adhesive resin sheet 20 of Embodiment 1, it is sufficient only to respectively form through holes in the first adhesive resin sheet 21 and the second adhesive resin sheet 22, being advantageous on the points of simplicity of the hole-forming process and improvement of processing accuracy.

<Embodiment 3>

Embodiment 3 is now described. In Embodiment 3, the hollow portion 206 to be formed in the adhesive resin sheet constituting the insulation layer 13 is formed as a through hole which is provided between via holes adjacent to each other in a manner to be separated from both of the via holes.

Figure 11:
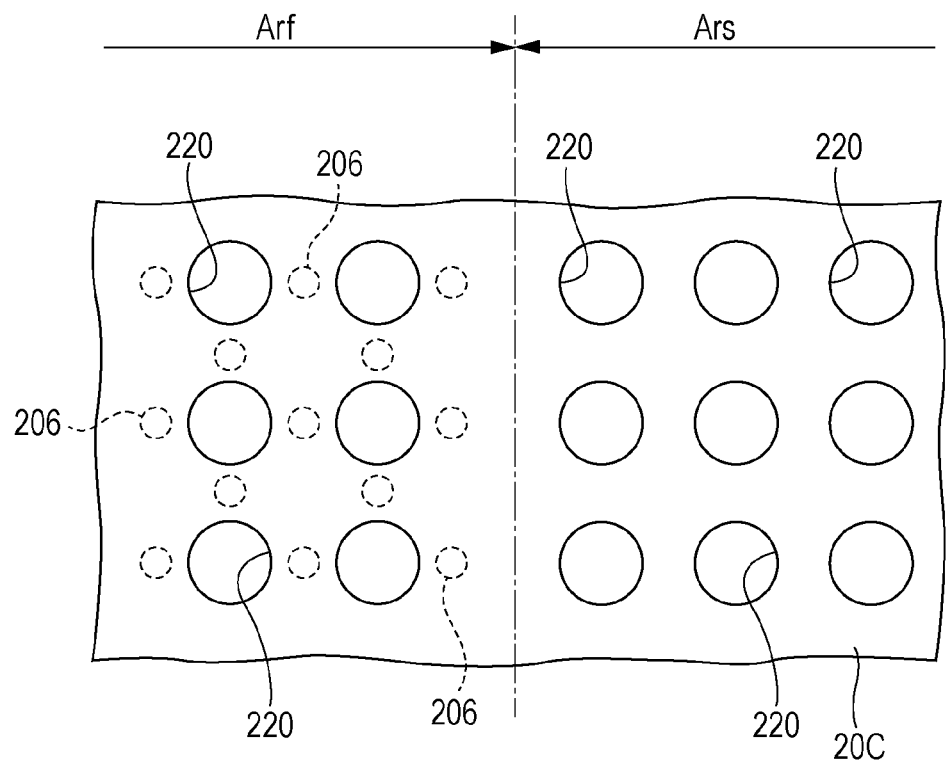
FIG. 11 illustrates part of an upper face of an adhesive resin sheet according to Embodiment 3.
Figure 12:
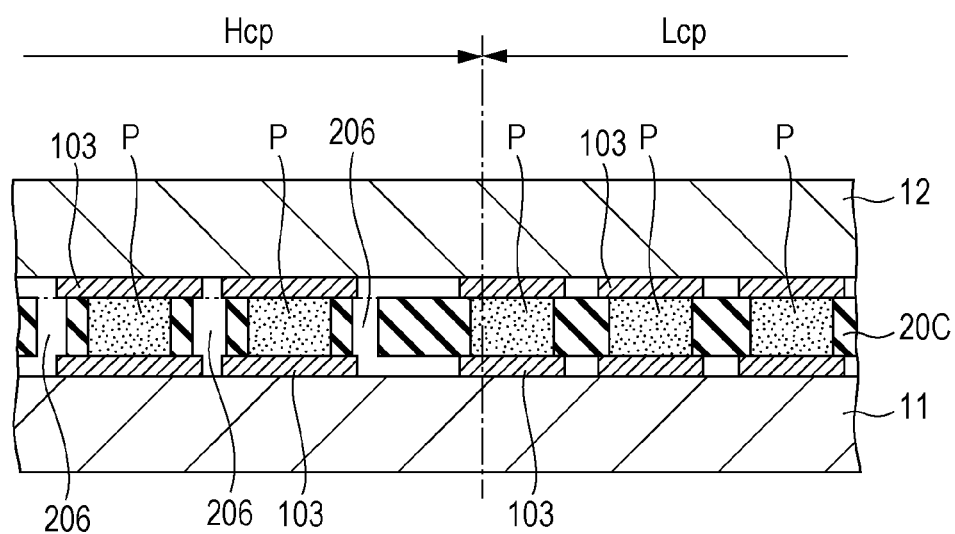
FIG. 12 illustrates a state in which the second board is disposed on the adhesive resin sheet in a manufacturing method of a layered circuit board according to Embodiment 3.

FIG. 11 illustrates part of an upper face of an adhesive resin sheet 20C according to Embodiment 3. In the example illustrated in FIG. 11, the left side of the adhesive resin sheet 20C corresponds to the first region Arf and the right side corresponds to the second region Ars. The adhesive resin sheet 20C is made of prepreg in a half-cured (B stage) state, which is obtained by impregnating a base material such as glass fiber cloth with thermosetting insulating resin such as epoxy resin, as is the case with the adhesive resin sheets 20A and 20B according to Embodiment 2. FIG. 12 illustrates a state in which the second board 12 is disposed on the adhesive resin sheet 20C. In the example of FIG. 12, a pad size of the conductor pad 103 in a region on the left side of FIG. 12 (conductor high-density region Hcp) is larger than that in a region on the right side (conductor low-density region Lcp). In the adhesive resin sheet 20C depicted in FIG. 11, portion of the first region Arf is arranged in the conductor high-density region Hcp depicted in FIG. 12 and portion of the second region Ars is arranged in the conductor low-density region Lcp.

As depicted in FIG. 11, in the adhesive resin sheet 20C, a via hole 220 (depicted as a circle drawn by a solid line in FIG. 11) to be filled with the conductive paste P is formed to penetrate through the adhesive resin sheet 20C in the thickness direction. A via diameter of the via hole 220 is set to have the first setting value Rv1, for example, and the via diameter does not change in the thickness direction of the adhesive resin sheet 20C. The hollow portion 206 depicted as a circle drawn by a dashed line in FIG. 11 is formed independently from the via hole 220 in the first region Arf of the adhesive resin sheet 20C.

The hollow portion 206 is a through hole penetrating through the adhesive resin sheet 20C in the thickness direction as is the case with the via hole 220 and is not filled with the conductive paste P. In the example illustrated in FIG. 11, the hollow portion 206 is formed between via holes 220 adjacent to each other in a manner to be separated from the via holes 220 in an independent state without being communicated. However, an arrangement example of hollow portions 206 is not limited to that depicted in FIG. 11. For example, hollow portions 206 may be provided on at least any positions in the first region Arf in the adhesive resin sheet 20C. Further, a planar forming pattern of the via holes 220 is not limited to the pattern depicted in FIG. 11. Further, the through hole according to the hollow portion 206 has a smaller diameter than the via diameter of the via hole 220 in the example of FIG. 11. However, the through hole is not limited to this, but may have a diameter equal to or larger than the via diameter.

As timing of forming a through hole according to the hollow portion 206 with respect to the adhesive resin sheet 20C, the through hole may be formed at the same time with a process of forming the via hole 220 or may be formed as a separated process. When a through hole according to the hollow portion 206 is formed before the via hole 220 is filled with the conductive paste P, it is preferable that an opening end of the hollow portion 206 be temporarily closed by a PET film or the like so as to keep the hollow portion 206 from being filled with the conductive paste P, for example. Alternatively, in order not to fill the hollow portion 206 with the conductive paste P, the conductive paste P is discharged from a nozzle or the like, which is not depicted, to fill the via hole 220 with the conductive paste P, for example.

Alternatively, the hollow portion 206 may be formed in the adhesive resin sheet 20C after the via hole 220 is filled with the conductive paste P. For example, the adhesive resin sheet 20C in which the via hole 220 is formed is first placed on the first board 11 and then the via hole 220 is filled with the conductive paste P. Subsequently, a through hole according to the hollow portion 206 may be formed by a laser or the like with respect to the adhesive resin sheet 20C which is in a state in which the via hole 220 is filled with the conductive paste P.

Then, as depicted in FIG. 12, the heat press treatment is performed in a state in which the adhesive resin sheet 20C is interposed between the first board 11 and the second board 12. When the heat press treatment is started, softened insulating resin of the adhesive resin sheet 20C moves to the hollow portion 206 which is formed in the first region Arf of the adhesive resin sheet 20C. Thus, a space to which the insulating resin, which is softened in the heat press treatment, of the adhesive resin sheet 20C is moved is sufficiently secured. Accordingly, the adhesive resin sheet 20C is easily squashed in the thickness direction even in the conductor high-density region Hcp of the layered circuit board 1 and the squashing amount may be sufficiently secured, in the heat press treatment. Consequently, a binding property among metal particles contained in the conductive paste P is improved, being able to suppress connection failure of the via 14.

(Layered Circuit Board After Layering)

A configuration property of the layered circuit board 1 which is manufactured by the manufacturing method according to Embodiment 3 is described. In the manufacturing method of the layered circuit board 1 according to Embodiment 3, the hollow portion 206 is provided as a space independent from the via hole 220. Therefore, a position, in a plane, of a resin singularly-existing portion RE" which is formed after the heat press treatment is different from that of Embodiment 1.

Figure 13:
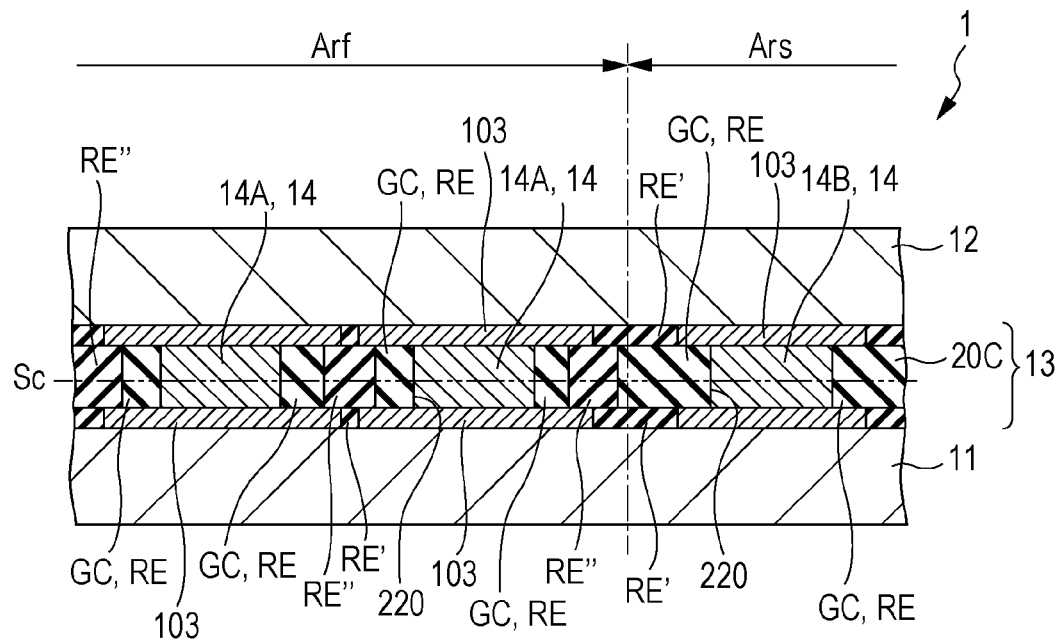
FIG. 13 schematically illustrates the peripheral configuration of a via in the layered circuit board according to Embodiment 3.

FIG. 13 schematically illustrates the peripheral configuration of the via 14 in the layered circuit board 1 according to Embodiment 3. FIG. 13 illustrates a state of the layered circuit board 1 after the heat press treatment is finished. A via 14 denoted by 14A in FIG. 13 belonging to the first region Arf of the insulation layer 13 is depicted on the left side of FIG. 13 and a via 14 denoted by 14B in FIG. 13 belonging to the second region Ars is depicted on the right side of FIG. 13. The second region Ars of the insulation layer 13 is sectioned into a region in which the via 14B is formed and a region in which glass fiber cloth GC and cured insulating resin RE of the adhesive resin sheet 20C are integrated, at a via cross section Sc. In the example illustrated in FIG. 13, a region of the via 14B and a region in which the glass fiber cloth GC and the cured insulating resin RE of the adhesive resin sheet 20C are integrated are defined by a wall surface of the via hole 220 of the adhesive resin sheet 20C as a boundary. The region of the via 14B is formed at the inner side of the boundary and the region in which the glass fiber cloth GC and the cured insulating resin RE are integrated is formed at the outside of the boundary.

On the other hand, in the first region Arf of the insulation layer 13, part of thermosetting insulating resin, which is softened in the heat press treatment, of the adhesive resin sheet 20C moves to or flows into a portion, on which the hollow portion 206 (refer to FIG. 12) is formed when the heat press treatment is started, so as to be cured. Accordingly, the portion in which the hollow portion 206 is formed when the heat press treatment is started forms the resin singularly-existing portion RE" in which the glass fiber cloth GC of the adhesive resin sheet 20C does not exist and cured insulating resin exists, through the heat press treatment. In the example illustrated in FIG. 13, the resin singularly-existing portion RE" is independently formed between the vias 14A adjacent to each other in a manner to be separated from the vias 14A. The above-described configuration property of the layered circuit board 1 may be the property confirming that the layered circuit board 1 is manufactured by the manufacturing method according to Embodiment 3.

<Embodiment 4>

Embodiment 4 is now described. In Embodiment 4, a hollow portion to which insulating resin, which is softened in the heat press treatment, of an adhesive resin sheet is moved or allowed to escape is formed in the adhesive resin sheet by using difference between opening diameters of a via hole formed in the adhesive resin sheet and an opening of a mask member.

Figure 14:
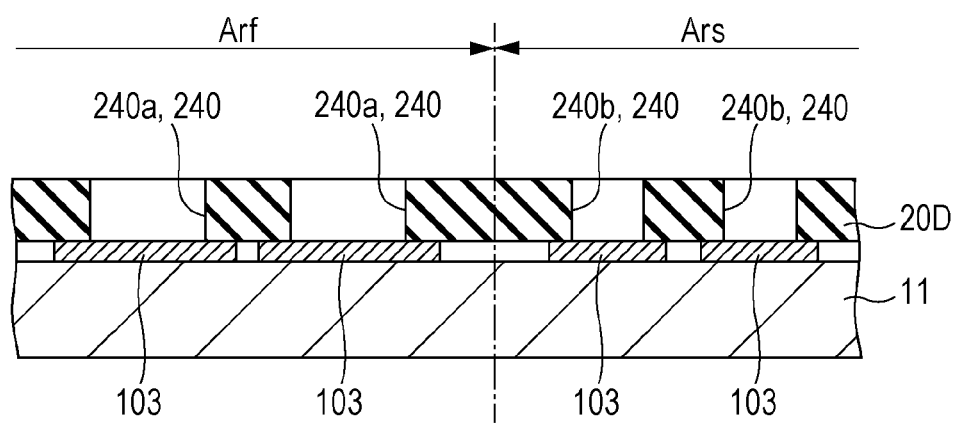
FIG. 14 illustrates a state in which an adhesive resin sheet is disposed on the first board in a manufacturing method of a layered circuit board according to Embodiment 4.
Figure 15:
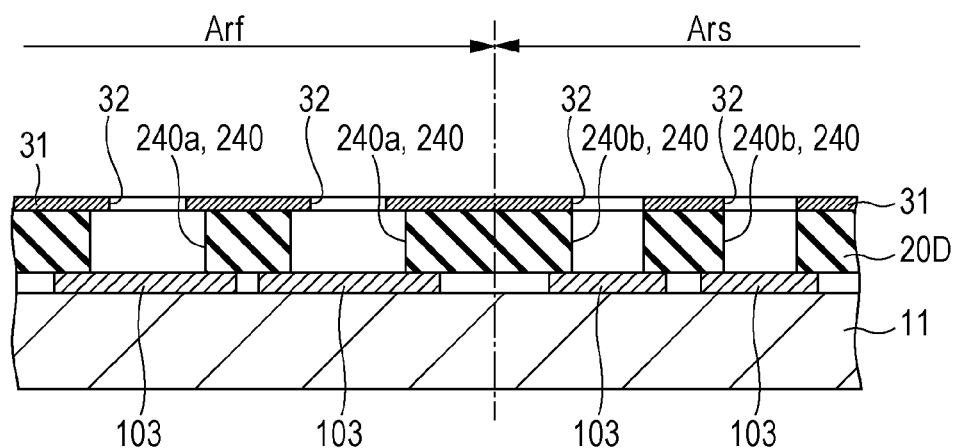
FIG. 15 illustrates a state in which a mask member is disposed on the adhesive resin sheet in a manufacturing method of a layered circuit board according to Embodiment 4.
Figure 16:
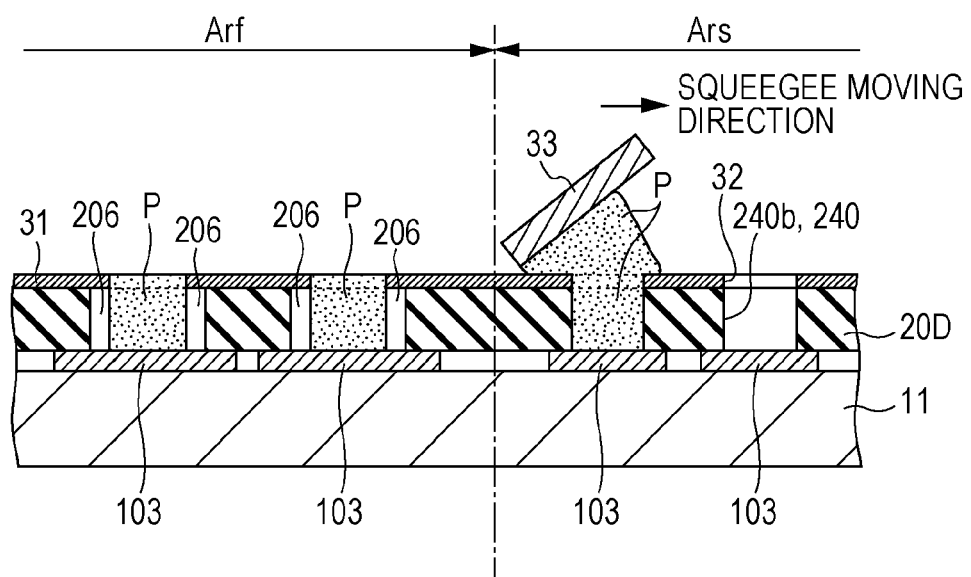
FIG. 16 illustrates a state in which a via hole is filled with the conductive paste in the manufacturing method of a layered circuit board according to Embodiment 4.
Figure 17:
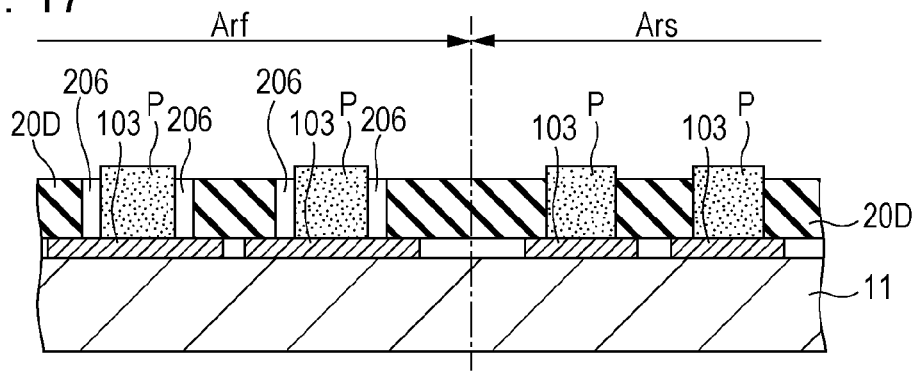
FIG. 17 illustrates a state in which the mask member is removed in the manufacturing method of a layered circuit board according to Embodiment 4.
Figure 18:
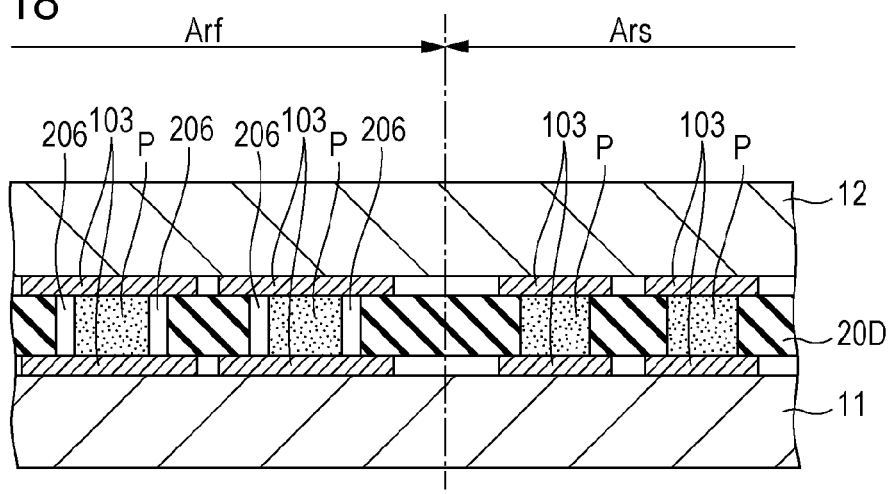
FIG. 18 illustrates a state in which a second board is disposed on the adhesive resin sheet in the manufacturing method of a layered circuit board according to Embodiment 4.
Figure 19:
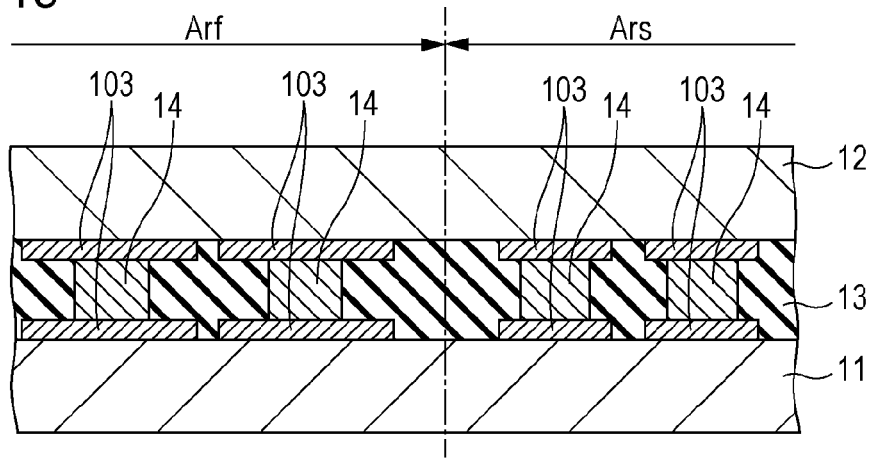
FIG. 19 illustrates a state of the heat press treatment in the manufacturing method of a layered circuit board according to Embodiment 4.

FIG. 14 illustrates a state in which an adhesive resin sheet 20D is disposed on the first board 11. FIG. 15 illustrates a state in which a mask member 31 is disposed on the adhesive resin sheet 20D. FIG. 16 illustrates a state in which a via hole of the adhesive resin sheet 20D is filled with the conductive paste P. FIG. 17 illustrates a state in which the mask member 31 is removed. FIG. 18 illustrates a state in which the second board 12 is disposed on the adhesive resin sheet 20D. FIG. 19 illustrates a state of the heat press treatment.

The adhesive resin sheet 20D according to Embodiment 4 is first described with reference to FIG. 14. The adhesive resin sheet 20D is made of prepreg in a half-cured (B stage) state, which is obtained by impregnating a base material such as glass fiber cloth with thermosetting insulating resin such as epoxy resin, as is the case with the adhesive resin sheet 20C, for example. In the adhesive resin sheet 20D, a via hole 240 which is to be filled with the conductive paste P is formed on a predetermined position in a manner to penetrate through the adhesive resin sheet 20D in the thickness direction. In FIG. 14, a region on the left side of FIG. 14 corresponds to the first region Arf and a region on the right side of FIG. 14 corresponds to the second region Ars. The via hole 240 formed in the adhesive resin sheet 20D is formed on a position corresponding to the conductor pad 103 which is formed on the bonding face 111 of the first board 11.

A via diameter of the via hole 240 is now described. Among via holes 240, a via hole formed in the first region Arf of the adhesive resin sheet 20D is denoted as a first via hole 240a and a via hole formed in the second region Ars is denoted as a second via hole 240b. For example, the via diameter of the second via hole 240b is set to have the first setting value Rv1 and the via diameter of the first via hole 240a is set to have the second setting value Rv2 which is larger than the first setting value Rv1. The first setting value Rv1 and the second setting value Rv2 are common to those of Embodiment 1, and the detailed description thereof is omitted here. The hole-forming process of the via hole 240 (240a, 240b) in the adhesive resin sheet 20D may be performed before the adhesive resin sheet 20D is disposed on the first board 11 or may be performed after the disposing on the first board 11. Further, in the example illustrated in FIG. 14, opening areas of a lower end and an upper end of the first via hole 240a of the adhesive resin sheet 20D are equal to each other. However, the first via hole 240a may be formed so that the opening area of the lower end is larger than the opening area of the upper end.

Then, a lower face (rear face) of the mask member 31 of a paste supply apparatus (printing apparatus) which is not depicted is superposed on an upper face of the adhesive resin sheet 20D which is disposed on the first board 11 (refer to FIG. 15). The mask member 31 is composed of a stainless steel plate, for example, but may be made of other materials such as urethane and plastic. In the mask member 31, an opening 32 from which the via hole 240 is exposed is provided so as to correspond to a position of the via hole 240 (240a, 240b). A case where the via hole 240 and the opening 32 have a circular shape is described as an example here, but other shape may be employed. The mask member 31 is formed so that a center of each via hole 240 (240a, 240b) of the adhesive resin sheet 20D and a center of the opening 32 are accorded with each other when the mask member 31 is placed on the upper face of the adhesive resin sheet 20D.

Filling of the via hole 240 of the adhesive resin sheet 20D with the conductive paste P is now described. In a filling process with the conductive paste P in this embodiment, the via hole 240 is filled with the conductive paste P by a squeegee method using a mask member. The mask member 31 is placed on the upper face of the adhesive resin sheet 20D in a manner to be positioned so that the opening 32 corresponds to each position of the via hole 240. The paste filling apparatus includes a squeegee 33 and a movable unit (not depicted) which may move the squeegee 33 along a surface of the mask member 31 in a state that a lower end of the squeegee 33 is abutted on the surface of the mask member 31. The paste filling apparatus moves the squeegee 33 along the surface of the mask member 31 in a printing direction while supplying the conductive paste P between the surface of the squeegee 33 and the surface of the mask member 31. As a result, as depicted in FIG. 16, the conductive paste P is conveyed along the surface of the mask member 31 and the conductive paste P is supplied from the opening 32 to the via hole 240.

An opening diameter of the opening 32 of the mask member 31 is equal to a via diameter of the second via hole 240b which is formed in the second region Ars of the adhesive resin sheet 20D. Consequently, an opening area of the second via hole 240b in the second region Ars is equal to an opening area of the opening 32 of the mask member 31. In the second region Ars of the adhesive resin sheet 20D, the whole of the inner space of the second via hole 240b is filled with the conductive paste P, so that no hollow portion 206 is formed consequently. On the other hand, a via diameter (opening area) of the first via hole 240a which is formed in the first region Arf of the adhesive resin sheet 20D is larger than the opening diameter (opening area) of the opening 32 of the mask member 31 (refer to FIG. 15). As a result, a space which is not filled with the conductive paste P, that is, the hollow portion 206 is formed in a portion, which is not vertically overlapped with the opening 32 of the mask member 31, in the first via hole 240a (refer to FIG. 16).

Subsequently, after the mask member 31 is removed from the adhesive resin sheet 20D, the second board 12 is disposed on the adhesive resin sheet 20D (refer to FIGS. 17 and 18). Then, the first board 11 and the second board 12 is heated and pressurized in a manner to sandwich the adhesive resin sheet 20D therebetween (refer to FIG. 19). Thus, the heat press treatment is performed. At this time, the hollow portion 206 is formed in the first region Arf of the adhesive resin sheet 20D, so that a sufficient space to which insulating resin, which is melted to be softened in the heat press treatment, of the adhesive resin sheet 20D is moved may be secured. Accordingly, metal particles contained in the conductive paste P are favorably bound to each other in the conductor high-density region Hcp of the layered circuit board 1 as well, being able to suppress electrical connection failure of the via 14.

<Electronic Device>

Figure 20:
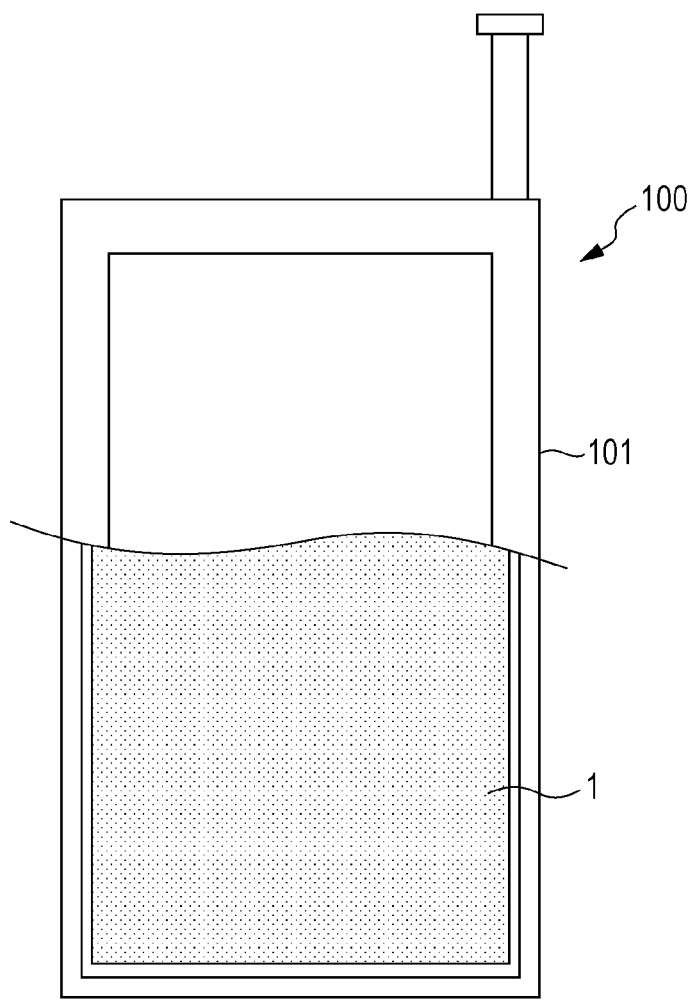
FIG. 20 illustrates an electronic device including the layered circuit board according to the embodiments.

The layered circuit board 1 which is manufactured by the manufacturing method according to above described respective embodiments is applicable to various electronic devices. FIG. 20 illustrates an example of an electronic device 100 in which the layered circuit board 1 according to the embodiments is built in. A mobile telephone is illustrated as the electronic device 100 in FIG. 20 as an example. However, the electronic device 100 is not limited to the mobile telephone, but the embodiments of the present disclosure may be applied as various electronic devices such as a personal computer, a server, an information processing terminal (PDA), and a digital camera. The layered circuit board 1 is housed in the inside of a case body 101 of the electronic device 100. Further, on a surface of the layered circuit board 1, electronic components such as a semiconductor chip package are mounted, for example.

Thus, as described with reference to FIG. 8 according to Embodiment 1, for example, the layered circuit board 1 includes the insulation layer 13 in which insulating resin is cured in a manner to contain a base material, the first and second boards 11 and 12 of which respective bonding faces are bonded with each other with the insulation layer 13 interposed, and the via 14. The via 14 is arranged in the insulation layer 13 and electrically connects the conductor pad which is formed on the bonding face of the first board 11 and the conductor pad which is formed on the bonding face of the second board 12. A portion in which only insulating resin is curd is formed in part of the insulation layer 13 in the first region Arf in which the conductive area rate Rcp is equal to or more than the reference ratio Rcpb. According to such layered circuit board 1, connection failure of the via 14 may be avoided even when a region with high conductor area rate and a region with low conductor area rate are mixed in the board planar direction, ensuring credibility of quality of the electronic device 100 including the layered circuit board 1. Further, the yield of the layered circuit board 1 is improved by avoiding connection failure of the via 14. Accordingly, productivity of the electronic device 100 employing the layered circuit board 1 may be enhanced and manufacturing cost of the electronic device 100 may be reduced.

The above-described embodiments may be combined as much as possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A manufacturing method of a layered circuit board in which a first board and a second board are layered, the manufacturing method comprising:
    arranging an adhesive resin sheet on the first board so that one face of the adhesive resin sheet faces the first board, the adhesive resin sheet including a plurality of variant via holes, a first opening area on one face of each of the plurality of variant via holes being larger than a second opening area on another face, the adhesive resin sheet being a sheet obtained by bonding an upper layer sheet portion on a lower layer sheet portion, a plurality of openings with the first opening areas and a plurality of openings with the second opening areas being previously formed on the lower layer sheet and the upper layer sheet, respectively;
    filling the variant via holes with conductive paste;
    arranging the second board on the other face of the adhesive resin sheet after the filling with the conductive paste; and
    performing heat press treatment to apply pressure to the adhesive resin sheet in a layering direction of the first board and the second board under heat,
    the variant via holes are formed only in a first region in which a conductor area rate of the adhesive resin sheet is equal to or more than a certain reference ratio.

2. The manufacturing method of a layered circuit board according to claim 1, wherein the adhesive resin sheet further includes a plurality of via holes, an opening area on one face of each of the plurality of via holes is equal to an opening area on another face.

3. The manufacturing method of a layered circuit board according to claim 2, wherein
the lower layer sheet portion includes a plurality of first through holes, each of the plurality of first through holes includes a first cross section area in the first region,
the upper layer sheet portion includes a plurality of second through holes in the first region, each of the plurality of second through holes includes a second cross section area that is smaller than the first cross section area, and
each of the variant via holes includes the first through hole and the second through hole.

4. The manufacturing method of a layered circuit board according to claim 1, wherein a thickness of the lower layer sheet portion is thicker than a thickness of the upper layer sheet portion.

5. The manufacturing method of a layered circuit board according to claim 1, wherein each of the plurality of the variant via holes includes a taper shape in which a via diameter gradually narrows from the one face toward the other face.

6. The manufacturing method of a layered circuit board according to claim 1, wherein a ratio between an opening area on the one face and an opening area on the other face in each of the plurality of the variant via holes is changed in accordance with a value of a conductor area rate of the adhesive resin sheet.

7. The manufacturing method of a layered circuit board according to claim 6, wherein a difference between the opening area on the one face and the opening area on the other face in each of the plurality of the variant via holes is increased in a region in which the conductor area rate of the adhesive resin sheet is higher.

8. A manufacturing method of a layered circuit board in which a first board and a second board are layered, the manufacturing method comprising:
arranging on the first board an adhesive resin sheet so that one face of the adhesive resin sheet faces the first board, the adhesive resin sheet including a plurality of variant via holes, a first opening area on one face of each of the plurality of variant via holes being larger than a second opening area on another face, the adhesive resin sheet being a sheet obtained by bonding an upper layer sheet portion on a lower layer sheet portion, a plurality of openings with the first opening areas and a plurality of openings with the second opening areas being previously formed on the lower layer sheet and the upper layer sheet, respectively;
filling each of the plurality of the via holes with conductive paste by a squeegee method that uses a mask member;
arranging the second board on the adhesive resin sheet after the filling with the conductive paste; and
performing heat press treatment to apply pressure to the adhesive resin sheet in a layering direction of the first board and the second board under heat; wherein
an opening area of the via holes is larger than a corresponding opening area of the mask member, and
the opening area of each of the plurality of via holes is larger than the corresponding opening area of the mask member in a first region in which a conductor area rate of the adhesive resin sheet is equal to or more than a certain reference ratio.

9. The manufacturing method of a layered circuit board according to claim 8, wherein
the opening area of each of the plurality of the via holes is equal to the opening area of the mask member in a second region in which the conductor area rate is lower than the certain reference ratio.

\* \* \* \* \*